(12) United States Patent
Yazaki et al.

(10) Patent No.: US 7,183,148 B2
(45) Date of Patent: Feb. 27, 2007

(54) DISPLAY PANEL AND METHOD FOR MANUFACTURING THE SAME

(75) Inventors: Akio Yazaki, Fuchu (JP); Mikio Hongo, Yokohama (JP); Mutsuko Hatano, Kokubunji (JP); Hiroshi Saito, Fujisawa (JP); Makoto Ohkura, Fuchu (JP)

(73) Assignee: Hitachi Displays, Ltd., Mobara (JP)

( * ) Notice: Subject to any disclaimer, the term of this patent is extended or adjusted under 35 U.S.C. 154(b) by 268 days.

(21) Appl. No.: 10/914,333

(22) Filed: Aug. 10, 2004

(65) Prior Publication Data

US 2005/0070035 A1 Mar. 31, 2005

(30) Foreign Application Priority Data

Sep. 25, 2003 (JP) ............................. 2003-333090

(51) Int. Cl.
*H01L 21/00* (2006.01)
(52) U.S. Cl. ................. 438/166; 438/487; 257/E21.134
(58) Field of Classification Search ................ 438/155, 438/166, 487; 257/E21.134
See application file for complete search history.

(56) References Cited

U.S. PATENT DOCUMENTS

| | | | |
|---|---|---|---|
| 5,372,836 A | * | 12/1994 | Imahashi et al. .... 257/E21.134 |
| 6,451,631 B1 | * | 9/2002 | Grigoropoulos et al. .... 438/487 |
| 2003/0068836 A1 | | 4/2003 | Hong |
| 2004/0197968 A1 | | 10/2004 | Peng |

FOREIGN PATENT DOCUMENTS

| | | |
|---|---|---|
| CN | 1536620 | 10/2004 |
| KR | 10-2004-0055940 | 10/2004 |

OTHER PUBLICATIONS

F. Takeuchi et al., "Performance of poly-Si TFTs fabricated by a Stable Scanning CW Laser Crystallization", AMD-LCD '01 (TFT4-3).

* cited by examiner

*Primary Examiner*—Chandra Chaudhari
(74) *Attorney, Agent, or Firm*—Antonelli, Terry, Stout and Kraus, LLP.

(57) ABSTRACT

An amorphous silicon film on an insulating substrate portion to be formed as an individual display panel in a large-sized insulating substrate is irradiated with a continuous-wave (CW) solid-state laser beam condensed linearly, while being scanned therewith at a fixed speed in the width direction of the condensed laser beam. A pixel portion and a peripheral circuit portion in the same insulating substrate portion are irradiated with the laser beam temporally modulated to have a power density high enough to provide predetermined crystallinity. The amorphous silicon film is transformed into a silicon film having crystallinity corresponding to performance required for thin film transistors to be built in each of the pixel portion and the peripheral circuit portion. In such a manner, a thin film transistor circuit having optimum crystallinity required in the pixel or peripheral circuit portion can be obtained while high throughput is kept. Thus, a product having good display features as a display panel can be provided inexpensively.

13 Claims, 29 Drawing Sheets

DEFECTIVE RATE IN THE BACKGROUND ART=21/70

DEFECTIVE RATE IN PRESENT INVENTION=4/70

FIG. 25
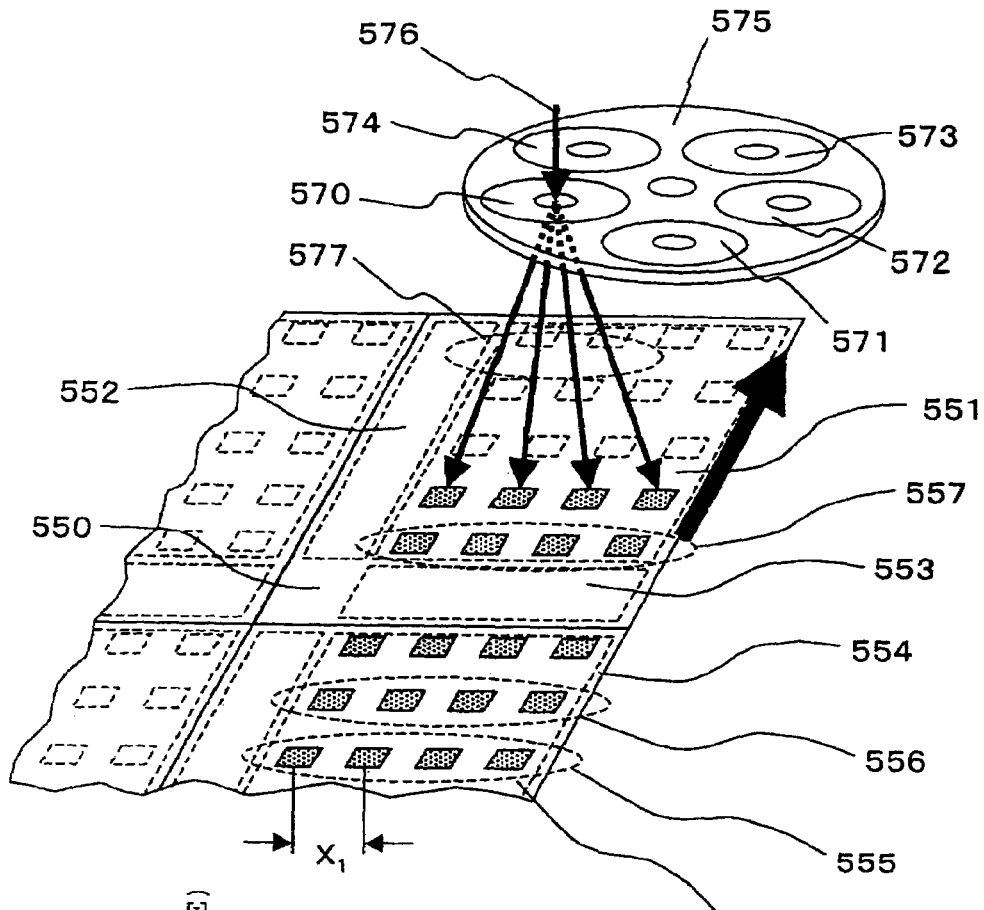
(a)
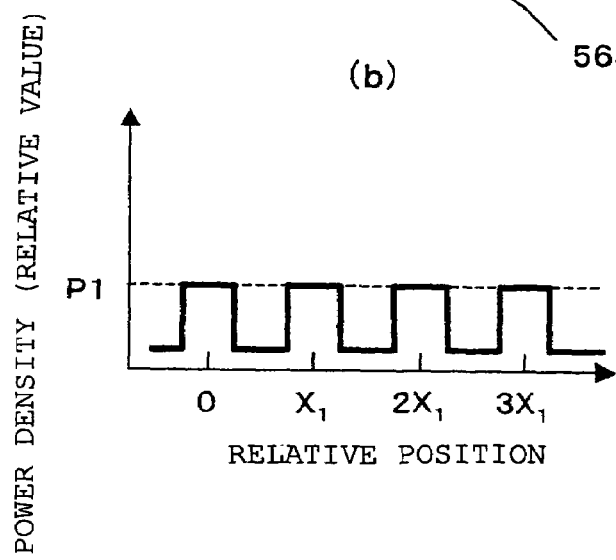
(b)

FIG. 27
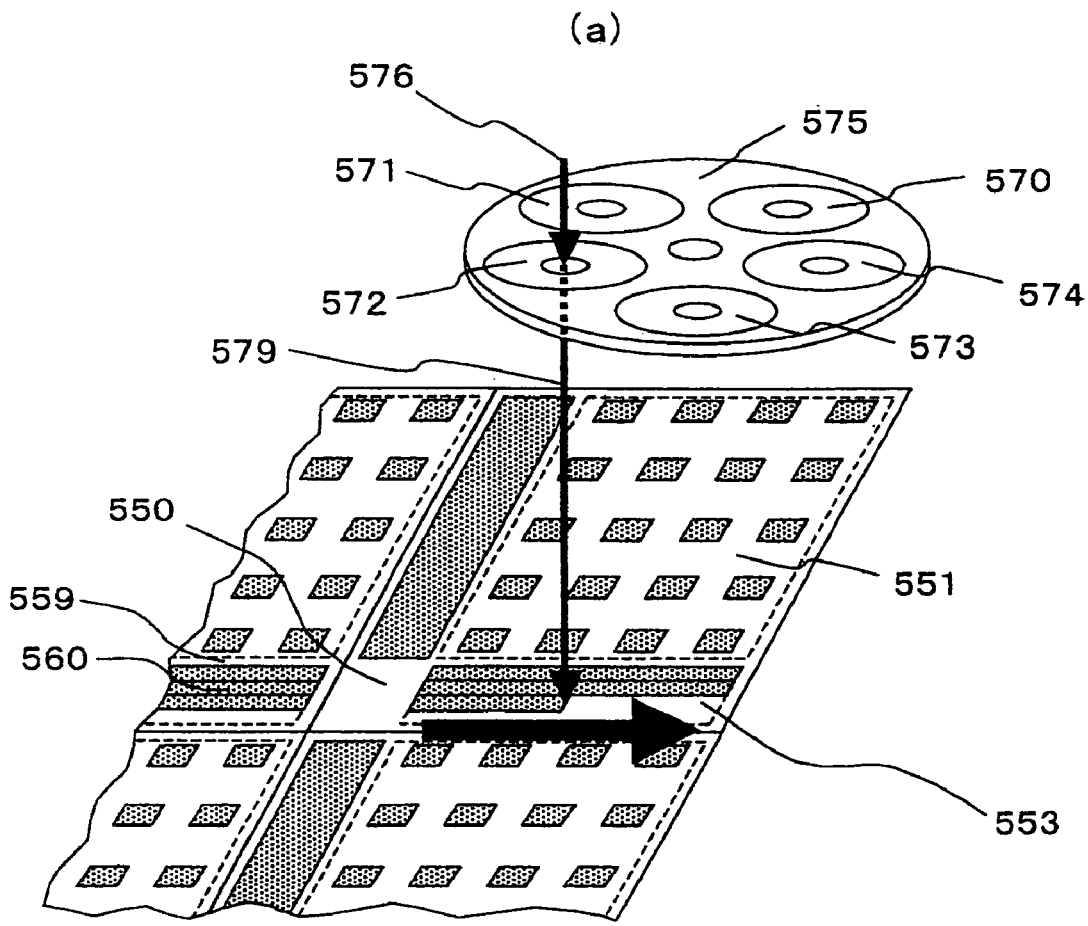
(a)
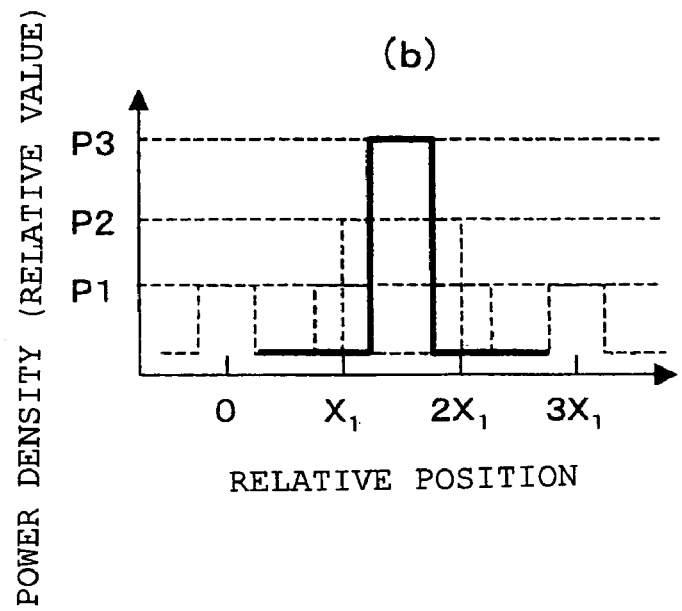
(b)
RELATIVE POSITION

FIG. 29
(a)
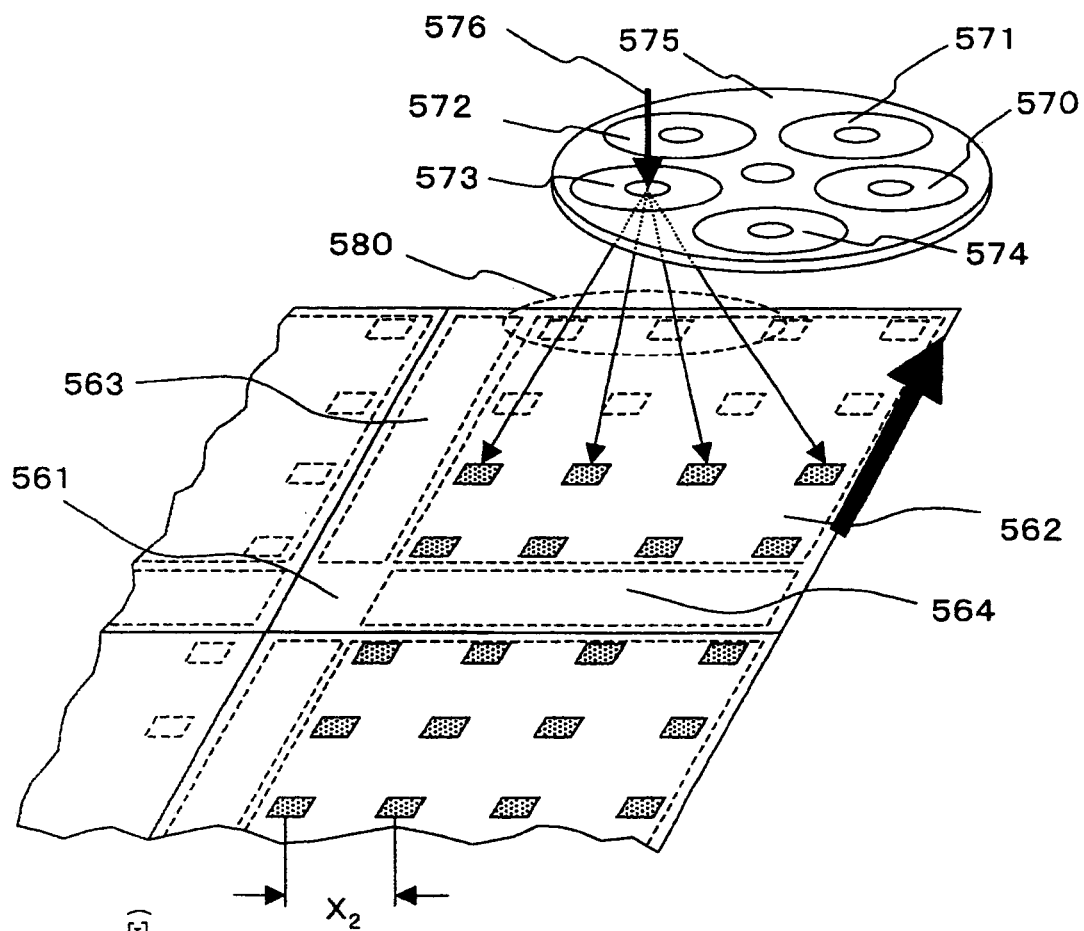
(b)
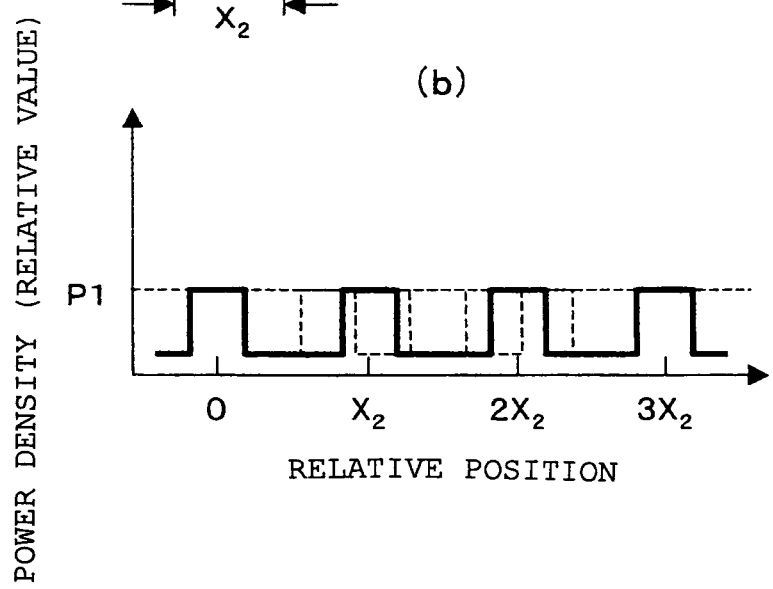

DISPLAY PANEL AND METHOD FOR MANUFACTURING THE SAME

BACKGROUND OF THE INVENTION

The present invention relates to a method for manufacturing a display panel in which an amorphous or poly-crystalline semiconductor film formed on an insulating substrate is irradiated with a laser beam so that the film quality is improved or crystal grains are enlarged or transformed to be single-crystalline, and a display panel manufactured in the same manufacturing method, and particularly relates to a method for manufacturing a display panel having active devices such as thin film transistors formed out of a semiconductor film transformed to be single-crystalline, and a display panel manufactured in the same manufacturing method.

In current liquid crystal or organic electroluminescence display units, an image is formed by switching thin film transistors formed out of an amorphous silicon film in a pixel portion (display region) on an insulating substrate of glass, fused quartz or the like. Exponential reduction in manufacturing cost and improvement of reliability can be expected if driver circuits for driving the thin film transistors in the pixel portion, that is, a gate driver circuit portion, a drain driver circuit portion, and a set of other required circuits can be formed concurrently on the insulating substrate.

In the present circumstances, however, the silicon film forming the active layer of transistors is so poor in crystallinity that the performance of the thin film transistors represented by mobility is low. It is therefore difficult to manufacture circuits required to have a high speed and a high function. In order to manufacture such high-speed and high-function circuits, high-mobility thin film transistors are required. In order to realize the high-mobility thin film transistors, it is necessary to improve the crystallinity of the silicon film.

As a method for improving the crystallinity, excimer laser annealing has been used in the background art. According to this method, an amorphous silicon film (whose mobility is not higher than 1 $cm^2/Vs$) formed on an insulating substrate of glass or the like is irradiated and annealed with an excimer laser so that the amorphous silicon film is transformed (reformed) into a poly-crystalline silicon film. Thus, the mobility is improved.

In the poly-crystalline silicon film obtained by irradiation with the excimer laser, the grain size is about several hundreds of nanometers and the mobility is about 100 $cm^2/Vs$. The poly-crystalline silicon film has enough performance to drive the thin film transistors in the pixel portion, but it is deficient in performance to be applied to a driver circuit for driving a display panel, or the like. In addition, projections of several tens to several hundreds of nanometers formed in the grain boundaries depress the voltage durability of the thin film transistors. Further, a wide variation in energy among pulses in the excimer laser narrows the process margin. In addition thereto, due to use of harmful gas, the cost of equipment increases. Moreover, an expensive oscillating tube has to be exchanged periodically so that the running cost increases extremely.

As a solution to the aforementioned problems, Non-Patent Document 1 discloses an annealing technique using a continuous-wave laser.

[Non-Patent Document 1] F. Takeuchi et al. "Performance of poly-Si TFTs fabricated by a Stable Scanning CW Laser Crystallization", AM-LCD '01 (TFT4-3).

SUMMARY OF THE INVENTION

In the aforementioned background-art technique, the amorphous silicon film formed on the glass substrate is scanned with a second harmonic of an LD (Laser Diode) pumped continuous-wave $YVO_4$ laser so that crystals are grown in the scanning direction of the laser beam. Thus, the mobility beyond 500 $cm^2/Vs$ is obtained. No projection is produced in the obtained poly-crystalline film. When such a high mobility can be obtained, a driver circuit having sufficient performance can be formed so that a so-called system-on panel having a driver circuit together directly on an insulating substrate constituting a display panel can be realized.

It has been, however, revealed experimentally that the aforementioned method has the following problem. That is, when there is a defect such as a pin hole or a contamination in the amorphous silicon film formed on the substrate, there occurs a phenomenon that silicon fused by laser irradiation coheres like a stripe starting at the defect or contamination. Once the cohesion occurs, a coherent region extends like a sectoral and ranges all over the irradiation width of the laser beam. The cohesion continues till the laser irradiation is stopped. Silicon does not exist as a film in the region where the cohesion occurs. Therefore, no thin film transistor can be formed in the region. A panel having such a coherent region becomes defective, so that the manufacturing yield deteriorates.

It is an object of the present invention to solve the foregoing problems belonging to the background art. It is another object of the present invention to provide a method for manufacturing a display panel in which the manufacturing yield is improved, and a poly-crystalline silicon film producing no projection causing the lowering of the voltage durability is formed in accordance with performance required for various circuits to be formed on an insulating substrate, and a display panel manufactured in the same manufacturing method. Incidentally, the silicon film will be also referred to as "film" simply.

In the method for manufacturing a display panel according to the present invention, a continuous-wave (CW) solid-state laser beam is condensed linearly, and the amorphous silicon film is irradiated with the condensed laser beam while being scanned therewith in the width direction thereof at a fixed speed. In this event, the CW laser beam is temporally modulated, and an irradiation region (a peripheral circuit portion and a pixel portion) in one and the same insulating substrate portion constituting a display panel is irradiated with the temporally modulated CW laser beam with a fixed power density. When the irradiation is terminated, the laser beam output is cut down or off till the laser beam arrives at a subsequent irradiation region of another insulating substrate portion. After that, irradiation is started again as soon as the laser beam arrives at the subsequent irradiation region. As the large-sized insulating substrate is scanned with the laser beam at a fixed speed, the operation is continued on all the insulating substrate portions constituting individual display panels to be formed on the insulating substrate. Thus, thin film transistors are formed in the regions irradiated with the laser beam.

In another method for manufacturing a display panel according to the present invention, a CW solid-state laser beam is condensed linearly, and an amorphous silicon film is irradiated with the condensed laser beam while being scanned therewith in the width direction thereof at a fixed speed. In this event, the CW laser beam is temporally modulated, and a peripheral circuit portion in one and the same insulating substrate portion constituting a display panel is irradiated with a high power density or a middle power density, while a pixel portion is irradiated with a low power density. When the irradiation is terminated in the same insulating substrate portion, the laser beam output is cut down or off till the laser beam arrives at a subsequent irradiation region of another insulating substrate portion. After that, irradiation is started again as soon as the laser beam arrives at the subsequent irradiation region. As the large-sized insulating substrate is scanned with the laser beam at a fixed speed, the operation is continued on all the insulating substrate portions constituting individual display panels to be formed on the insulating substrate. Thus, thin film transistors are formed in the regions irradiated with the laser beam.

In a display panel according to the invention, thin film transistors for use in a peripheral circuit portion including driver circuits, etc. and a pixel portion are comprised of a lateral grown poly-crystalline silicon film obtained as follows. That is, a CW solid-state laser beam is condensed linearly on an amorphous silicon film. The amorphous silicon film is irradiated with the linearly condensed laser beam while being scanned therewith at a fixed speed in the width direction of the condensed laser beam. In this event, the laser beam is temporally modulated.

In another display panel according to the invention, thin film transistors for use in a peripheral circuit portion including driver circuits, etc. and a pixel portion are arranged as follows. That is, a CW solid-state laser beam is condensed linearly on an amorphous silicon film. The amorphous silicon film is irradiated with the linearly condensed laser beam while being scanned therewith at a fixed speed in the width direction of the condensed laser beam. In this event, the laser beam is temporally modulated as follows. That is, the amorphous silicon film forming thin film transistors for use in a drain driver circuit of the peripheral circuit portion including driver circuits, etc. is irradiated with the laser beam having a high power density so as to obtain a lateral grown poly-crystalline silicon film. The amorphous silicon film forming thin film transistors for use in the pixel portion is irradiated with the laser beam having a low power density so as to obtain a poly-crystalline silicon film made from fine crystal grains. The amorphous silicon film forming thin film transistors for use in a gate driver circuit is irradiated with the laser beam having a middle or high power density so as to obtain a lateral grown poly-crystalline silicon film or a grain poly-crystalline silicon film.

According to the method for manufacturing a display panel according to the present invention, a CW solid-state laser beam temporally modulated, that is, modulated in intensity of the laser beam in accordance with time, is condensed linearly on an amorphous silicon film formed on an insulating substrate of glass or the like. Thus, the amorphous silicon film is annealed and transformed to have performance satisfying performance required for a silicon film forming thin film transistors for use in each region including a region where thin film switching transistors forming a pixel portion should be formed, a region where a peripheral circuit including driver circuits should be formed, and so on. As a result, damage (occurrence of cohesion) on the silicon film is suppressed, or occurring damage (coherent portion) is prevented from extending to a broad range, so that display panels can be manufactured at a high yield rate. In addition, any annealing like this can be performed using a solid-state laser beam as a heat source. Thus, it is possible to reduce the running cost which has been required for performing excimer laser annealing in the background art.

Further, thin film transistors operating at a high speed can be formed on an insulating substrate of glass or the like. Accordingly, it is possible to realize a so-called system-on panel (also referred to as "system-in panel") of a liquid crystal display or an organic electroluminescence display including driver circuits, interface circuits, etc. In the case of a liquid crystal display, a corresponding substrate is pasted onto a display panel manufactured thus, and liquid crystals are charged into a gap between the both. In the case of an organic electroluminescence display, a display panel manufactured thus is coated with an emission layer and so on, and sealed with a sealing cap. The display panel obtained thus is received in a casing together with external circuits and other constituent members so as to form a display unit.

Incidentally, the present invention is not limited to any configuration that has been described above or any configuration of embodiments that will be described later. A so-called multiple formation system in which a plurality of individual display panels are manufactured out of a large-sized insulating substrate has been described in the aforementioned configurations. The invention is not limited to such a system, but it is also applicable to a system in which a large-sized insulating substrate itself is formed as an individual display panel.

BRIEF DESCRIPTION OF THE DRAWINGS

These and other features, objects and advantages of the present invention will become more apparent from the following description when taken in conjunction with the accompanying drawing wherein:

FIGS. 25A–25B are explanatory views for explaining the manufacturing process according to Embodiment 4 of the present invention;

FIGS. 27A–27B are explanatory views for explaining the manufacturing process according to Embodiment 4 of the present invention, following FIGS. 26A–26B;

FIGS. 29A–29B are explanatory views for explaining a manufacturing process according to Embodiment 5 of the present invention.

DETAILED DESCRIPTION OF PREFERRED EMBODIMENTS

The present invention will be described below in detail using its embodiments.

[Embodiment 1]

Figure 1:
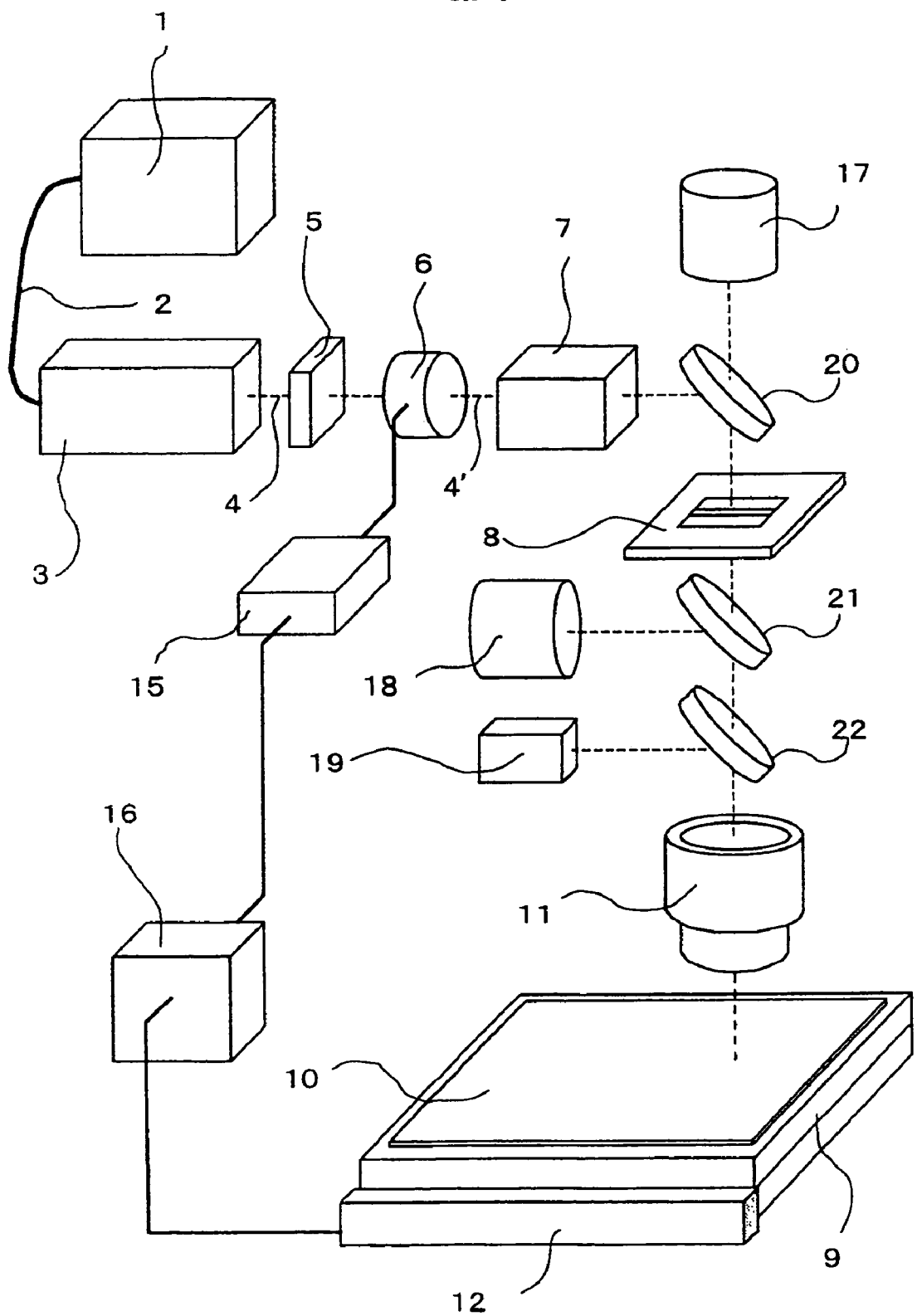
FIG. 1 is a schematic view for explaining an example of a configuration of an optical system and a control system of a laser annealing apparatus suitable for carrying out a method for manufacturing a display panel according to the present invention.

FIG. 1 is a schematic view for explaining a configuration example of an optical system and a control system of a laser annealing apparatus suitable for carrying out a method for manufacturing a display panel according to the present invention. In this configuration example, an LD pumped continuous-wave solid-state laser 3 by which infrared light generated from a laser (LD) placed in a laser power supply 1 is guided into an oscillator through an optical fiber 2 and excited in the oscillator is used as a laser source. The output of a continuous-wave (CW) laser beam 4 oscillated in the LD pumped continuous-wave solid-state laser (hereinafter referred to as "laser oscillator" simply) 3 is adjusted by an ND filter 5. The CW laser beam 4 is then incident on an EO modulator 6 so as to be temporally modulated by the EO modulator 6. The laser beam outputted from the EO modulator 6 passes through a homogenizer 7 for shaping the laser beam into a linear beam having an energy distribution uniform in the longitudinal direction thereof, and a rectangular slit 8 for cutting an excessive laser beam or adjusting the condensing size. The laser beam passing through the rectangular slit 8 is formed as a projected image of the slit by an objective lens 11, and an insulating substrate 10 mounted on a stage 9 is irradiated with the projected image.

A linear encoder (also referred to as "linear scale") 12 for detecting the position of the stage 9 is provided in the stage 9. The linear encoder 12 generates pulse signals corresponding to the position of the stage 9, and sends the pulse signals to a control unit 16. The control unit 16 counts the number of the pulse signals, and sends a control signal to an EO modulator driver 15 for driving the EO modulator 6 whenever the control unit 16 counts up to a predetermined number of pulses.

Incidentally, epi-illumination light sources 17 and 18, a TV camera 19 and so on are provided for alignment between the laser beam and the substrate 10 on the stage 9 and adjustment of the shape of the laser beam passing through the rectangular slit 8. Light from the epi-illumination light sources 17 and 18 is thrown into the optical path of the laser beam through half mirrors 20 and 21 respectively, while light is extracted from the optical path of the laser beam to the TV camera (CCD camera) 19 through a half mirror 22.

An oscillator capable of generating a continuous-wave beam of ultraviolet or visible wavelength is used as the laser oscillator 3. Particularly it is the most suitable to use a second harmonic (wavelength: 532 nm) of an LD pumped $YVO_4$ laser or an LD pumped YAG laser in terms of the output magnitude, the output stability or the like. However, the invention is not limited thereto. It is possible to use an argon laser, a third or fourth harmonic of an $YVO_4$ or YAG laser, a plurality of semiconductor lasers coupled through fibers, or the like.

The CW laser beam 4 generated from the laser oscillator 3 penetrates the variable transmittance ND filter 5 for adjusting the output, and enters the EO modulator 6. In this event, the beam diameter may be expanded to be close to the effective diameter of the EO modulator 6 by a beam expander (not shown) in consideration of the power resistance of the EO modulator 6. For example, assume that the beam diameter of the laser beam 4 generated from the laser oscillator 3 is about 2 mm, and the EO modulator 6 to be used has an effective diameter of 15 mm. A suitable rate of expansion of the beam expander is about 3 to 5 times.

The EO modulator 6 uses a combination of a Pockels cell (hereinafter referred to as "crystal" simply) and a polarized beam splitter. When the laser beam 4 is a linearly polarized light, setting is done as follows. When a voltage V1 (normally a voltage of 0 V) is applied to the crystal through the EO modulator driver 15, the polarization direction of the laser beam 4 is kept as it is without rotating. Thus, the laser beam 4 penetrating the crystal enters the polarized beam splitter as S-polarized light, so that the laser beam 4 is polarized at an angle of 90 degrees. That is, in this state, the laser beam 4 polarized at 90 degrees is outputted so that the laser beam 4 is not incident on the subsequent optical system. Thus, the laser beam 4 is turned OFF on the glass substrate 10 as an insulating substrate.

On the other hand, when a voltage V2 with which the laser beam 4 penetrating the crystal of the EO modulator 6 can be rotated at an angle of 90 degrees is applied, the polarization direction of the laser beam 4 rotates at an angle of 90 degrees. Thus, the laser beam 4 penetrating the crystal enters the polarized beam splitter as P-polarized light. In this event, the laser beam 4 penetrates the polarized beam splitter of the EO modulator 6, and goes straight. That is, in this state, the laser beam 4 going straight enters the subsequent optical system. Thus, the laser beam 4 is turned ON on the glass substrate 10.

Further, when the voltage to be applied to the crystal is varied between V1 (normally 0 V) and V2, the transmittance of the laser beam 3 penetrating the EO module 6 can be set desirably between T1 (normally 0) and T2 (maximal transmittance, that is, 1, in this embodiment). That is, the transmittance of the laser beam 4 penetrating the EO modulator 6 can be set desirably between 0 and 1. Incidentally, this is obtained on the assumption that there is no reflection or no absorption in the crystal surface or the polarized beam splitter surface.

From this, when the output (input into the EO modulator 6) of the laser beam 4 entering the EO modulator 6 is set at a fixed value P0 while the voltage to be applied to the crystal is varied among V1, V2, V3 and V4, stepwise pulse outputs P1 (0 V in this embodiment), P2, P3 and P4 can be obtained as laser outputs from the EO modulator 6. Here the output P2 is obtained as a product of the input P0 into the EO modulator 6 and the transmittance T2 when the voltage V2 is applied; P3 is obtained as a product of the input P0 and the transmittance T3 when the voltage V3 is applied; and P4 is obtained as a product of the input P0 and the transmittance T4 when the voltage V4 is applied. Not to say, the output of the penetrating laser beam 4 can be varied continuously if the voltage to be applied to the crystal is varied continuously. As a result, a laser beam 4' having a desired time scale can be obtained. Incidentally, detailed description will be made on the laser beam outputs P1, P2, P3 and P4.

Although description has been made here on the assumption that a crystal (Pockels cell) and a polarized beam splitter are combined as the EO modulator 6, various polarizers may be used instead of the polarized beam splitter. The EO modulator 6 will designate a combination of a crystal and a polarized beam splitter (or a polarizer) in the following description.

Incidentally, an AO (Acousto-Optical) modulator may be used in place of the EO modulator 6. In comparison with EO modulators, AO modulators are generally low in driving frequency, and somewhat low in diffraction efficiency to be in a range of from 70% to 80%, but they can be used in the present invention. When a modulator such as the EO modulator 6 or an AO modulator is used thus, irradiation can be initiated on a portion to be irradiated at a desired time (or position), put through a desired change in the output of a laser beam from the laser oscillator, and terminated at a desired time, while the laser beam is always outputted from the laser oscillator. That is, temporal modulation can be applied to the laser beam desirably.

The laser beam 4' turned ON by the EO modulator 6 is shaped into a linear beam (which is actually rectangular because it has a width in its lateral direction, but it will be referred to as "linear" simply unless the width in the lateral direction has to be especially referred to) by the beam homogenizer 7. An output beam from a gas laser oscillator or a solid-state laser oscillator usually has a circular and Gaussian energy distribution. Therefore, the output beam cannot be used directly for laser annealing in the present invention. If the oscillator output is sufficiently large, a substantially even and desired shape of the energy distribution can be obtained by expanding the beam diameter sufficiently and cutting a required shape from a comparatively even portion in the central portion of the expanded beam. However, the circumferential portion of the beam must be abandoned so that a major part of the energy is wasted. The beam homogenizer 7 is used to solve this defect and convert the Gaussian distribution into an even distribution.

Various types of homogenizers such as one using a multi-lens array, one having a combination of a Powell lens and a cylindrical lens, and one using a diffracted optical element, can be used as the beam homogenizer 7. Any means may be used if it can condense light linearly and obtain a longitudinally even energy distribution. The distribution in the width (lateral width) direction of the linear beam may be even or Gaussian. A linear beam measuring 10 mm in the longitudinal direction by 60 μm in the width direction on the rectangular aperture slit surface is formed by the beam homogenizer 7.

An unnecessary portion of the laser beam 41 condensed linearly by the beam homogenizer 7 is cut out by the electric rectangular aperture slit 8 so that the laser beam 4' is shaped into a desired rectangular shape. The shaped laser beam 4' is reduced and projected onto the glass substrate 10 by the objective lens 11. When the magnification of the objective lens 11 is M, the image of the electric rectangular aperture slit 8 or the laser beam 4' passing through the electric rectangular aperture slit 8 is projected in size scaled down in accordance with the reciprocal of the magnification of the objective lens 11, that is, in size scaled down to 1/M. Here assume that a 20-power objective lens is used. Then the linear beam measuring 10 mm in the longitudinal direction by 60 μm in the width direction in the position of the electric rectangular aperture slit 8 is radiated as a linear beam measuring 500 μm in the longitudinal direction by 3 μm in the width direction on the surface of the glass substrate 10.

Upon irradiation of the glass substrate 10 with the laser beam 4', the laser beam 41' is radiated on a desired position while the stage 9 is moved within a longitudinal and lateral plane (XY-plane). Once there occurs defocusing due to irregularities, undulation, etc. in the surface of the glass substrate 10, fluctuation in power density or unevenness in power density appears in the condensed laser beam 4, and the shape of irradiation deteriorates. Thus, an intended goal cannot be achieved. In accordance with necessity, therefore, a focal position is detected by an automatic focusing optics (not shown) so that irradiation can be always carried out in the focal position. When irradiation is out of the focal position, the stage 9 is adjusted in the height direction (Z-direction) or an optics is driven in the Z-direction so as to control the focal position (the projection position in the plane of the rectangular aperture slit 8) to always coincide with the surface of the glass substrate 10.

The surface of the glass substrate 10 to be irradiated with the laser beam 4' is illuminated with illumination light from the epi-illumination light source 18 through the half mirror 21, and imaged on the CCD camera 19. Thus, the surface of the glass substrate 10 can be observed on a monitor (not shown). In order to observe the surface of the glass substrate 10 during laser irradiation, a laser cut filter is inserted before the CCD camera 19 so as to prevent the CCD camera 19 from producing halation due to the laser beam reflected on the surface of the glass substrate 10 to thereby block the observation or to prevent the CCD camera 19 from being damaged in the worst case.

The glass substrate 10 can be aligned as follows. That is, images of alignment marks formed on the glass substrate 10 or corner portions or specific patterns of the glass substrate 10 are picked up at a plurality of places by the objective lens 11 and the CCD camera 19. If necessary, image processing such as binarization or pattern matching is performed on the picked-up images respectively by image processing units (not shown) so as to calculate the position coordinates thereof. Based on the position coordinates, the stage 9 is driven to align the glass substrate 10 with respect to three X-, Y- and θ-axes. Incidentally, the θ-axis designates an inclination of the XY-plane.

Although a single objective lens 11 is shown in FIG. 1, a plurality of objective lenses may be attached to an electric revolver. When the objective lenses are changed over in accordance with a signal from a control unit (not shown), they can be used appropriately in accordance with the contents of processing. That is, an optimal objective lens can be used for each processing of pre-alignment when the glass substrate 10 is mounted on the stage 10, precise alignment to be performed in accordance with necessity, laser annealing processing, observation after the annealing processing, alignment mark formation which will be described later, and so on. Alignment can be performed with a special-purpose optics (lenses, an imaging unit and an illumination unit). However, when an optics for laser annealing is shared as an alignment optics, detection and laser irradiation can be performed on one and the same optical axis so that the positional accuracy in the laser annealing is improved.

Next, Embodiment 1 of the method for manufacturing a display panel according to the invention, using the aforementioned optics, will be described with reference to FIGS. 1, 2A–2B, 3–6, 7A–7B, 8–10, and 11A–11C. Each target substrate here is a glass substrate about 0.3 mm to 1.0 mm thick. In one main surface of the glass substrate, an amorphous silicon thin film having a film thickness of from 30 nm to 150 nm has been formed through an insulator thin film. The substrate will be referred to as "glass substrate 10". The insulator thin film is an $SiO_2$ film, an SiN film or a composite film of them, having a film thickness of 50–200 nm.

Figure 2:
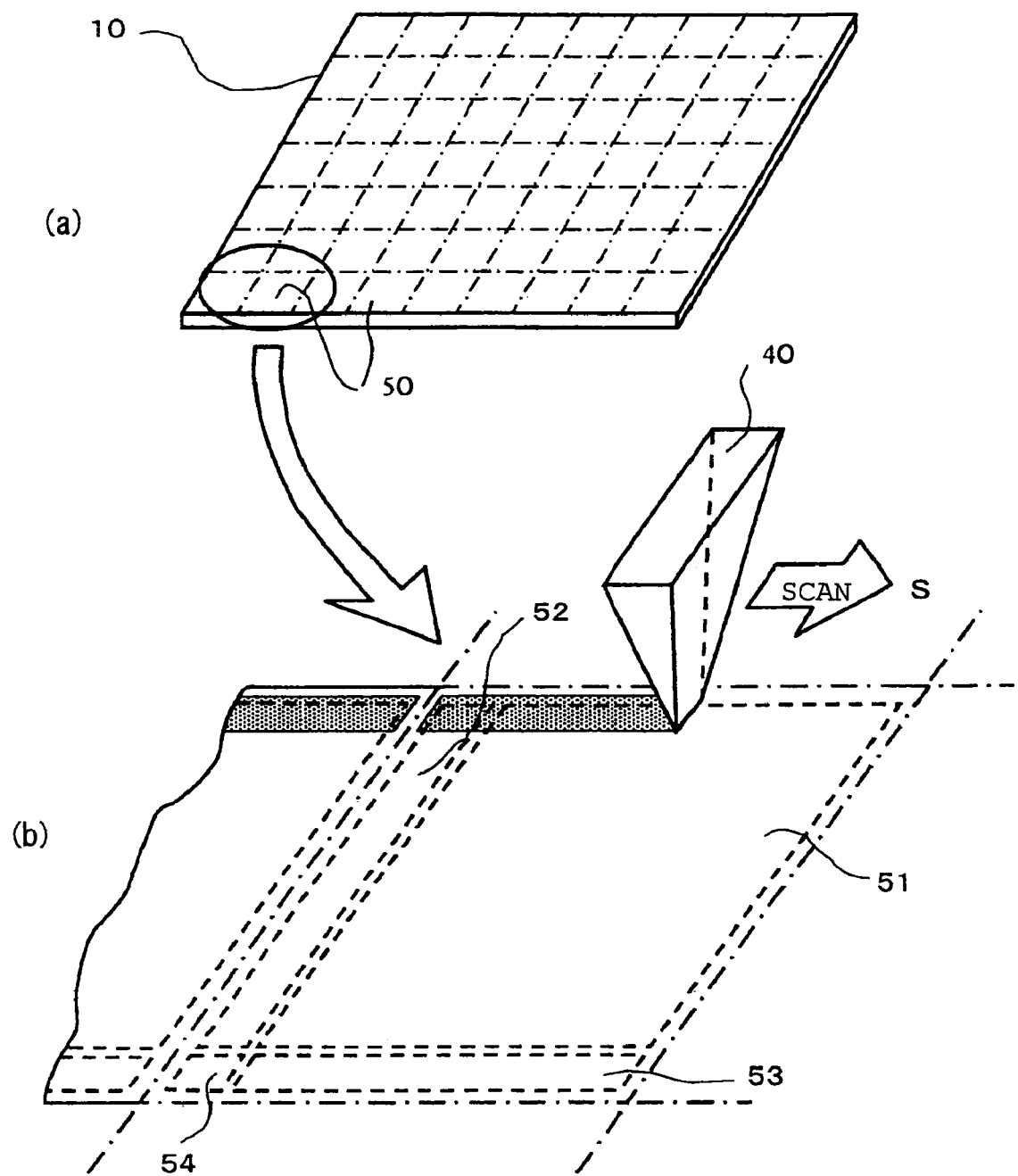
FIGS. 2A and 2B are schematic views for explaining a method for irradiating a glass substrate with a linear beam.
Figure 3:
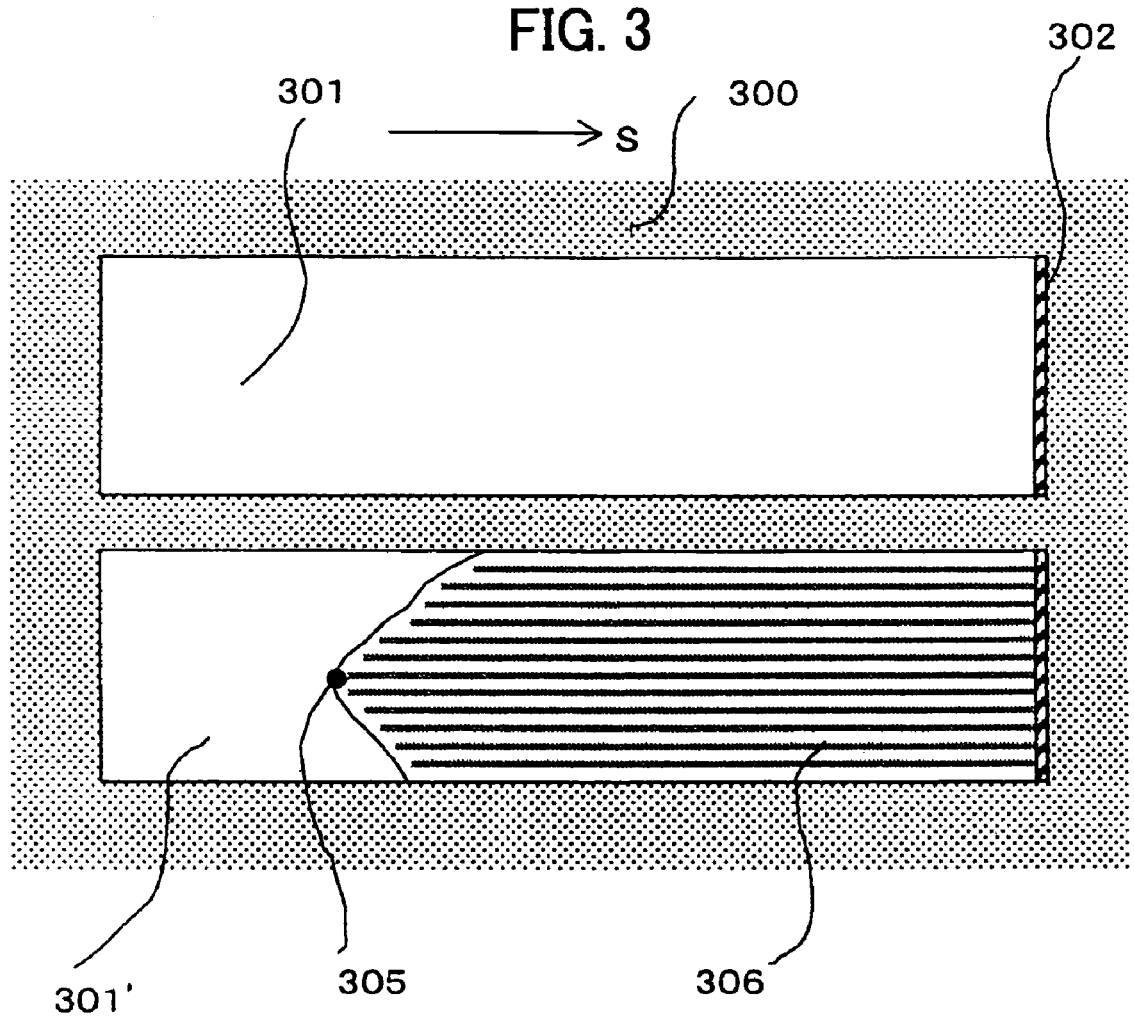
FIG. 3 is an explanatory view of cohesion occurring in a silicon film due to a film defect or a contamination adhering thereto.
Figure 4:
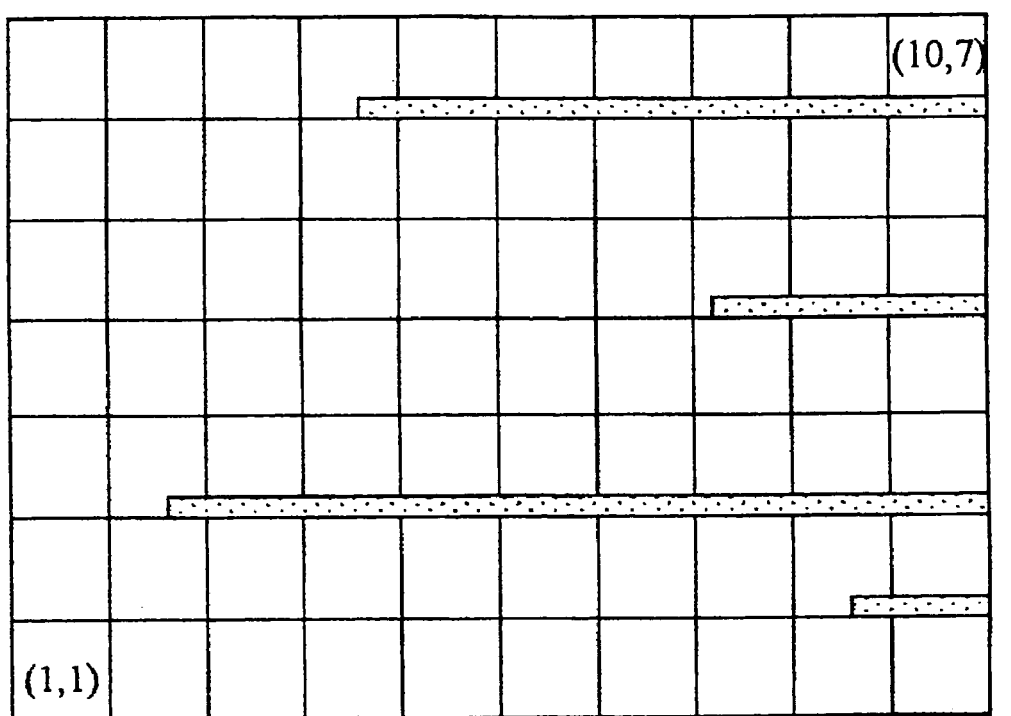
FIG. 4 is an explanatory view of occurrence of cohesion in a silicon film annealed in a background-art technique.
Figure 5:
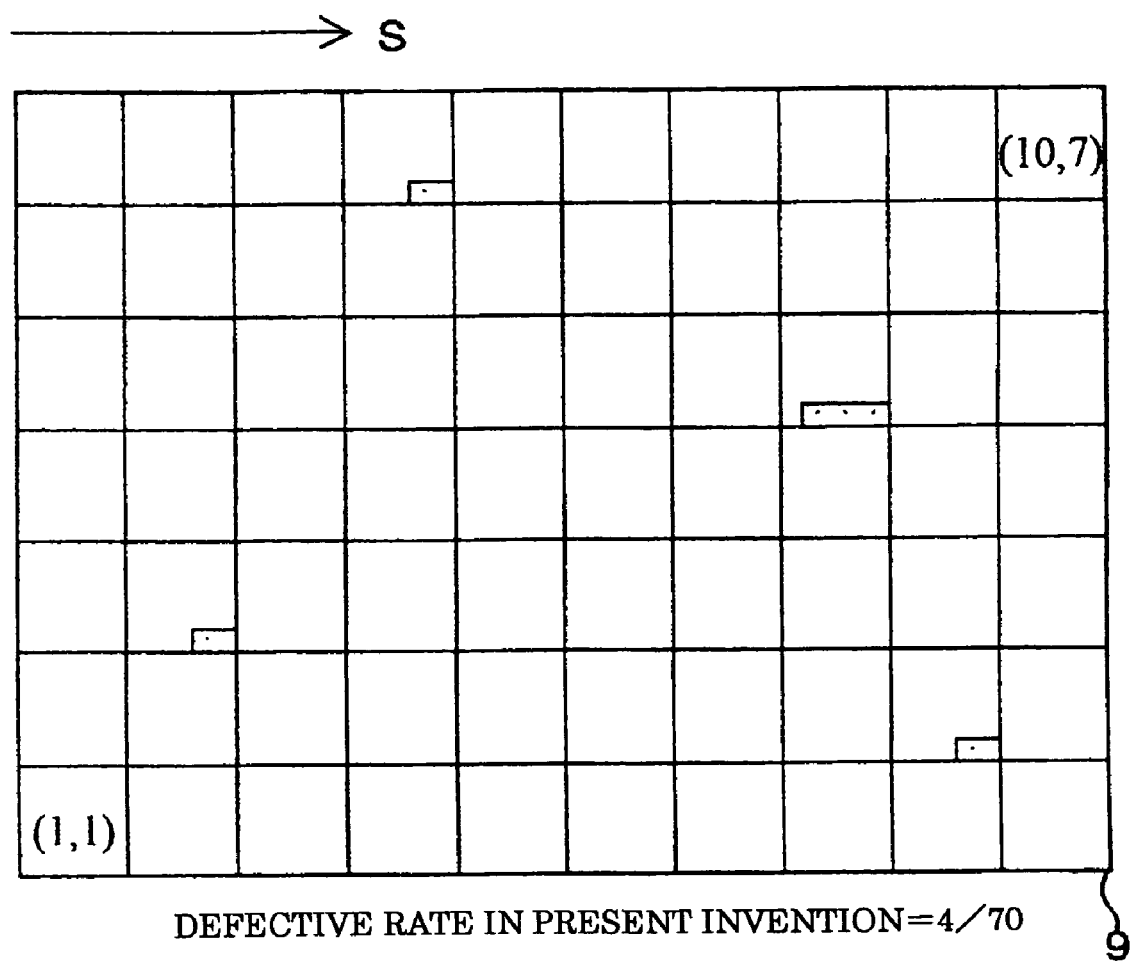
FIG. 5 is an explanatory view of occurrence of cohesion in a silicon film annealed in Embodiment 1 of a method for manufacturing a display panel according to the present invention.
Figure 6:
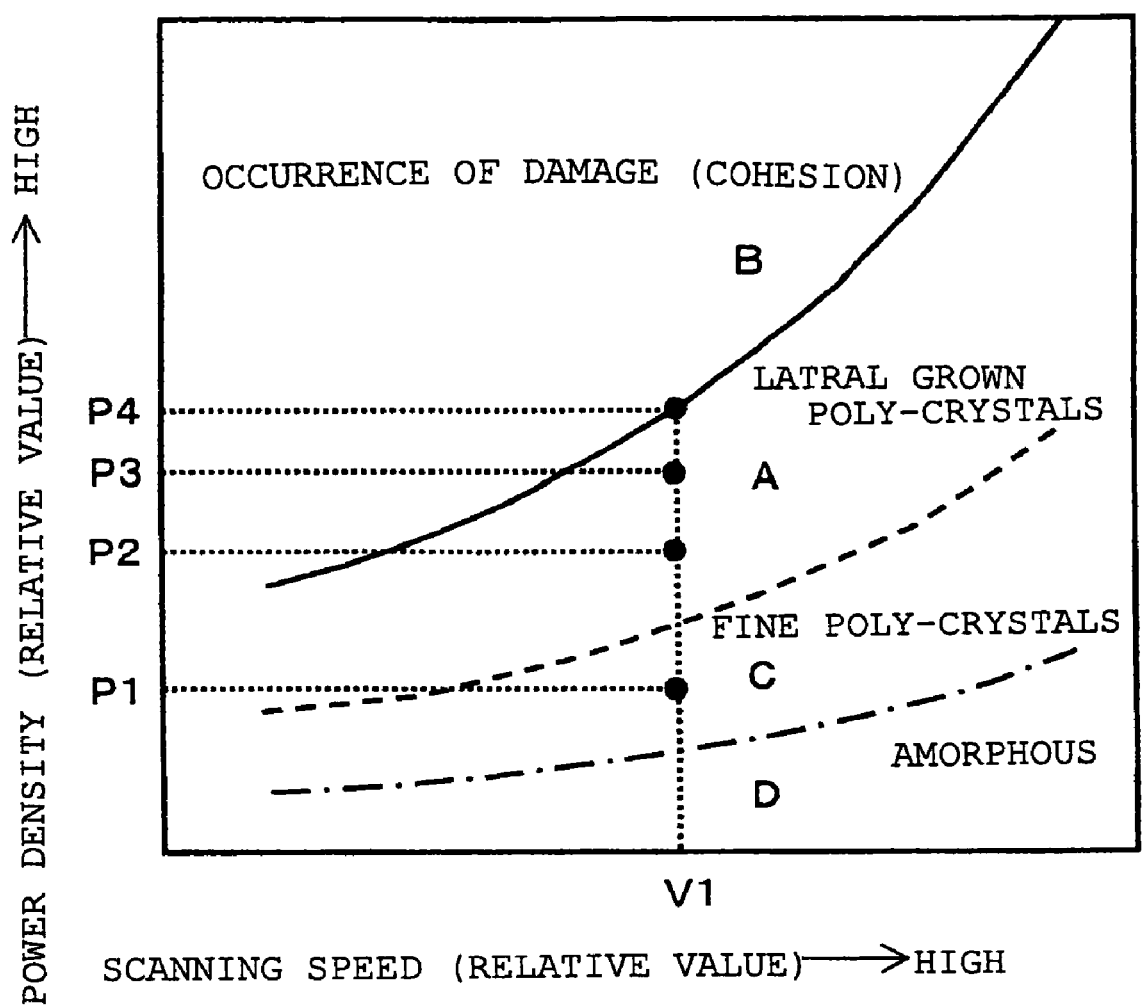
FIG. 6 is an explanatory view showing the state of crystals formed in a silicon film in accordance with the scanning speed and the power density of a laser beam for irradiation.
Figure 7:
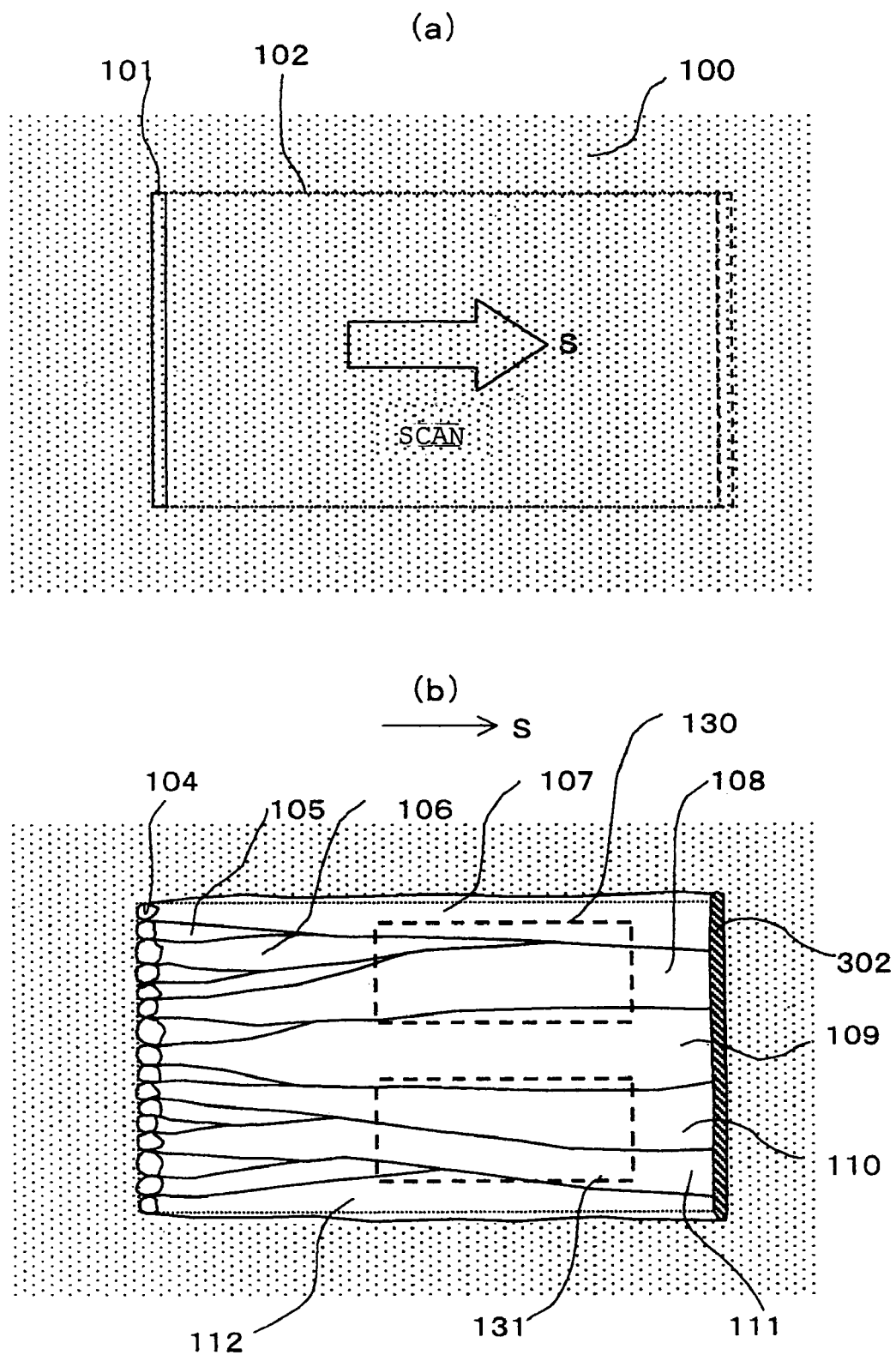
FIGS. 7A and 7B are explanatory views showing scanning with the laser beam and a lateral grown poly-crystalline film of the silicon film according to Embodiment 1 of the method for manufacturing a display panel according to the present invention.
Figure 8:
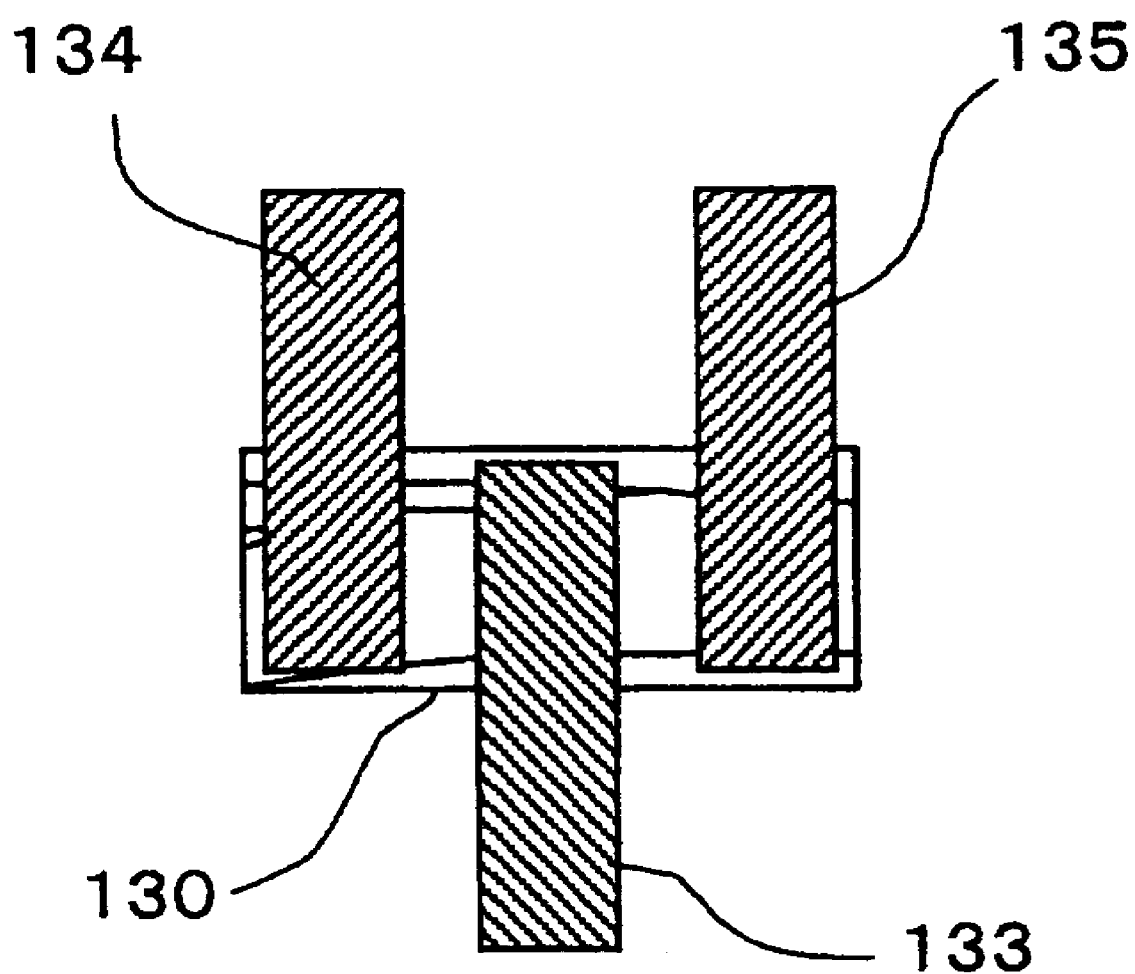
FIG. 8 is a schematic view for explaining the layout of thin film transistors to be built in silicon crystals transformed into the lateral grown poly-crystalline film according to Embodiment 1 of the method for manufacturing a display panel according to the present invention.
Figure 9:
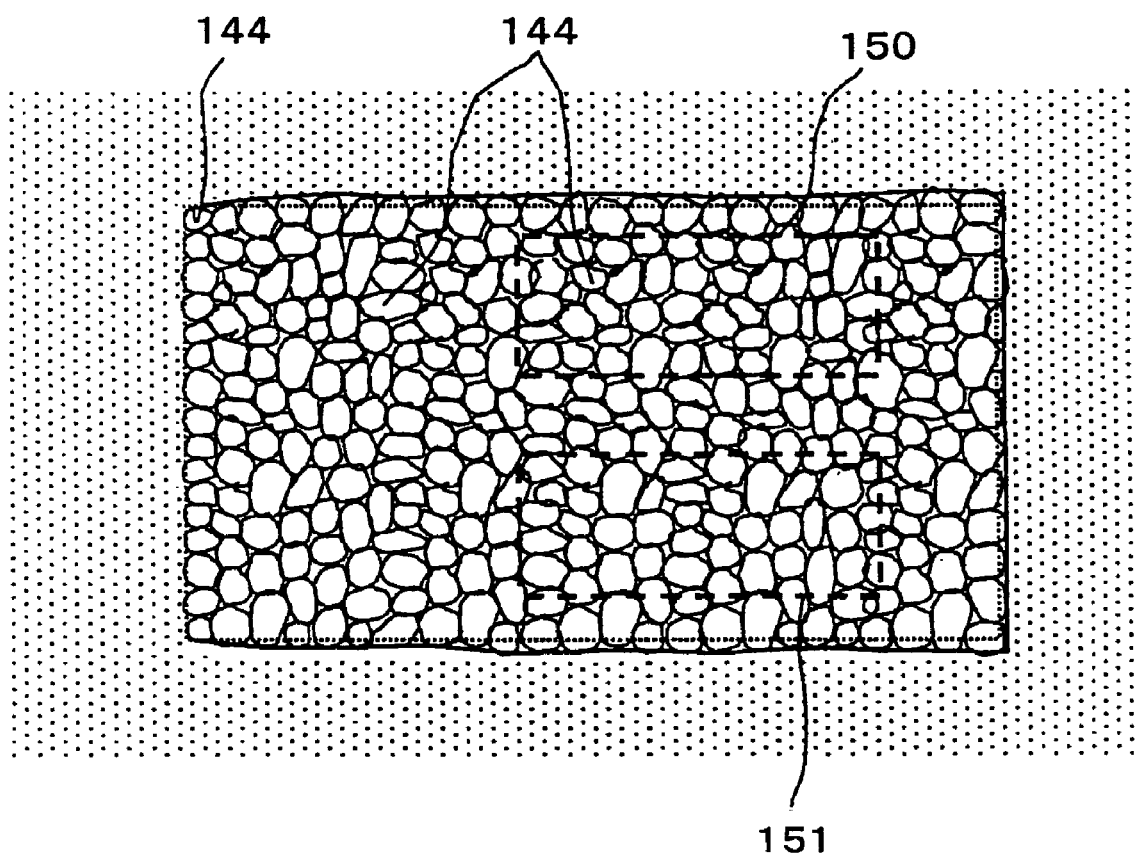
FIG. 9 is an explanatory view showing scanning with the laser beam and the grain poly-crystalline film of the silicon film according to Embodiment 1 of the method for manufacturing a display panel according to the present invention.
Figure 10:
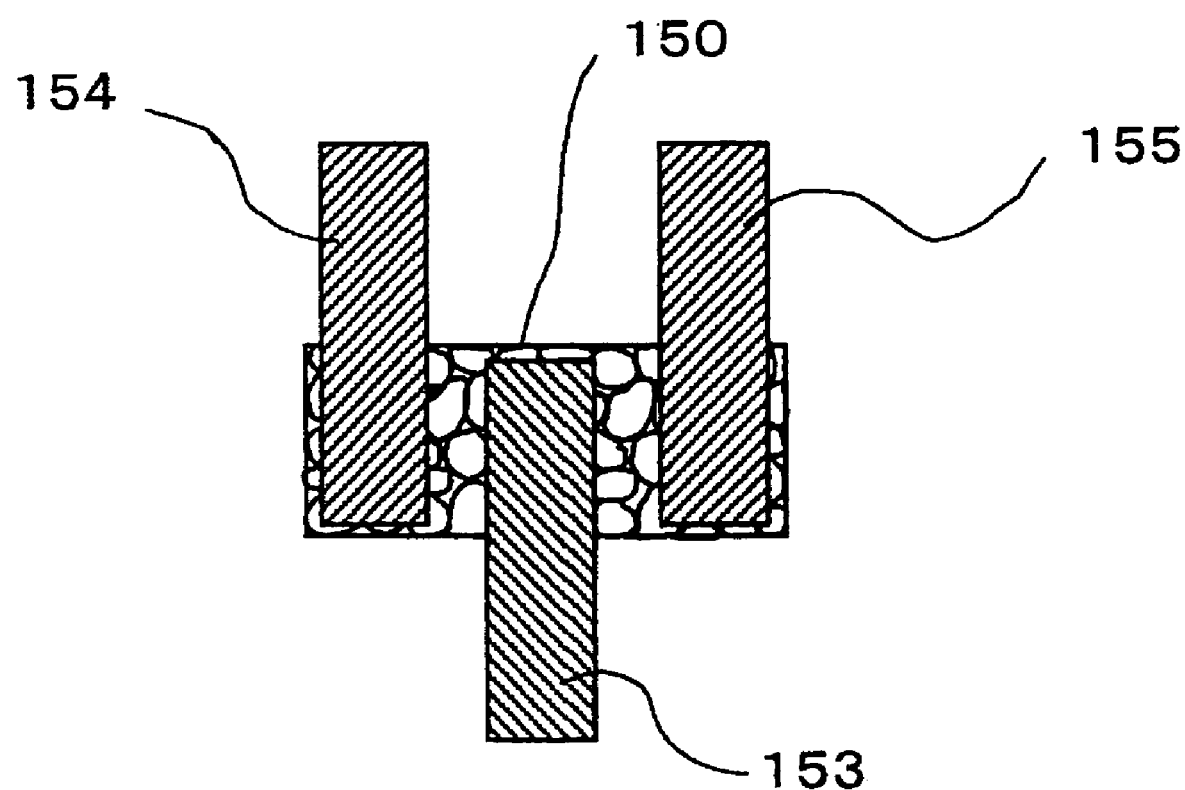
FIG. 10 is a schematic view for explaining the layout of thin film transistors to be built in silicon crystals transformed into a gain poly-crystalline film according to Embodiment 1 of the method for manufacturing a display panel according to the present invention.
Figure 11:
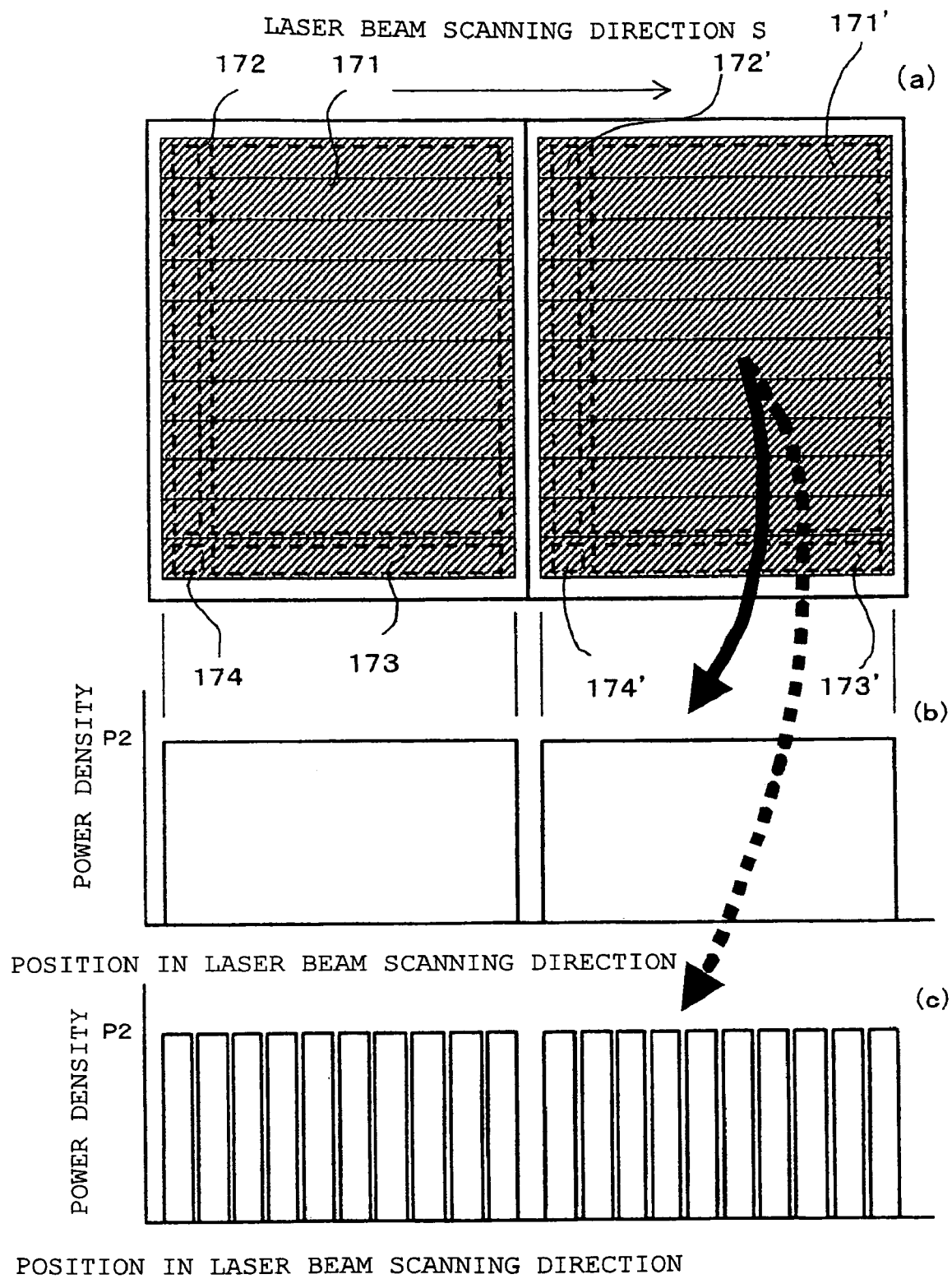
FIGS. 11A–11C are explanatory views showing the relationship between the stage movement and the power density of a laser beam for irradiation, for explaining Embodiment 1 of the method for manufacturing a display panel according to the present invention.

FIGS. 2A and 2B are schematic views for explaining a method for irradiating a glass substrate with a linear beam. FIG. 3 is an explanatory view of cohesion in a silicon film occurring due to a film defect or an attached contamination. FIG. 4 is an explanatory diagram of occurrence of cohesion in a silicon film annealed in a background-art technique. FIG. 5 is an explanatory diagram of occurrence of cohesion in a silicon film annealed in this embodiment. FIG. 6 is an explanatory diagram of the states of crystals in a silicon film formed in accordance with the scanning speed and the power density of a laser beam to irradiate the silicon film therewith. FIGS. 7A and 7B are explanatory views of scanning with a laser beam and a lateral grown poly-crystalline film of the silicon film in the manufacturing method according to this embodiment. FIG. 8 is a schematic view for explaining the arrangement of thin film transistors to be built in silicon crystals transformed into a lateral grown poly-crystalline film in the manufacturing method according to this embodiment. FIG. 9 is an explanatory view of scanning with a laser beam and a fine grain poly-crystalline film of a silicon film in the manufacturing method according to this embodiment. FIG. 10 is a schematic view for explaining the arrangement of thin film transistors to be built in silicon crystals transformed into a fine grain poly-crystalline film in the manufacturing method according to this embodiment. FIGS. 11A–11C are explanatory views showing the relationship between the stage movement and the power density of a laser beam for irradiation, for explaining Embodiment 1 of the method for manufacturing a display panel according to the present invention.

The glass substrate 10 is mounted on the stage 9 in FIG. 1. In the glass substrate 10, a plurality of glass substrate parts which will serve as individual display panels are formed as shown by the chain lines in FIG. 2A. In order to simplify the description, each glass substrate part will be hereinafter referred to as "panel 50". Each panel 50 has transistor formation regions including a pixel portion (display portion) 51, a gate driver circuit portion 52, a drain driver circuit portion 53 and a peripheral circuit portion 54. As shown in FIG. 2B, while relative scan with a laser beam 40 condensed linearly is continued, the transistor formation regions in each panel 50 are annealed with the laser beam 40 being temporally modulated. In FIG. 2B, the reference sign S designates the scanning direction.

Here, problems involved in the case where temporal modulation is not performed will be described with reference to FIG. 3. An amorphous silicon film 300 formed on a glass substrate is scanned relatively while being irradiated with a laser beam condensed linearly as shown in FIG. 2B. As for the power density of the laser beam, conditions are selected such that the irradiated silicon film will be fused so that crystal grains will grow up laterally (in the scanning direction: in the width direction) in the re-solidification process, and the grown crystals will be formed like a belt in the scanning direction S of the laser beam. Normally, as shown in the upper stage of FIG. 3, a poly-crystalline film made from crystals grown like a belt as will be described later is formed in a laser irradiated region 301. Then, projections 302 are formed in a terminal portion of the irradiation with the laser beam.

As shown in the lower stage of FIG. 3, however, there may be a defect 305 such as a pin hole or an attached contamination in the amorphous silicon film 300. In such a case, the fused silicon cannot exist as a film, but it is formed as silicon rods 306 cohering like stripes due to surface tension. The silicon rods 306 are formed at a pitch of several micrometers to several tens of micrometers in a direction perpendicular to the scanning direction S of the laser beam. An undercoat insulating film or the glass substrate is exposed between adjacent ones of the silicon rods 306. It is therefore impossible to form thin film transistors in the normal process. That is, a panel where such cohesion has occurred becomes defective. Further, once cohesion has occurred, the cohesion continues as long as the laser irradiation is continued.

With reference to FIGS. 4 and 5, consider that there are four defects or attached contaminations in a large-sized glass substrate 9 on the assumption that 70 individual display panels will be formed in the glass substrate 9 so as to perform multiple panel formation. The 70 individual display panels to be formed in the glass substrate 9 are shown by the coordinates (1, 1) to (10, 7) ranging from the upper left corner to the upper right corner. Assume that the glass substrate is scanned from its one end to the other end with a CW laser beam on the annealing conditions. Then, in a lateral line (parallel with the scanning direction S of the laser beam) where cohesion has occurred once, all the panels irradiated with the laser beam after the cohesion become defective due to the cohesion. The defective ratio is 21/70 in the case of FIG. 4 where annealing is performed in the background-art technique.

On the other hand, temporary modulation is applied to a laser beam, and the laser beam output is controlled to be suspended or lowered to prevent the crystalline structure of the silicon film from being changed (transformed) whenever annealing is terminated for at least one individual display panel, and to be a proper output as soon as the laser beam reaches a subsequent new individual display panel. As a result, as shown in FIG. 5, only four individual display panels become defective even when there are four defects or attached contaminations. The defective ratio in this case is 4/70. In such a manner, irradiation with a temporally modulated CW laser beam is extremely effective in improving the yield.

FIG. 6 is an explanatory diagrams showing the result of annealing performed when the energy density and the scanning speed of a laser beam applied on an amorphous silicon film formed on a glass substrate are used as parameters. The appropriate range of the scanning speed is 50–1,000 mm/s when a laser beam is shaped into a linear beam measuring 3–6 μm in the width direction. From the viewpoint of stable annealing and throughput, the appropriate range is 200–600 mm/s. On the other hand, the range of the power density allowing lateral growth is 0.4–1.0 MW/cm$^2$ in the scanning speed of 300 mm/s. Consider that annealing is performed with a constant scanning speed V1 of the laser beam in FIG. 6.

With a laser beam having a power density P2, crystals grow up laterally (in the width direction) with respect to the scanning direction of the laser beam through a fusion and re-solidification process. Thus, a so-called quasi-single crystalline film which is a belt-like poly-crystalline film is obtained. The quasi-single crystalline film has a film quality enough to form transistors setting up a driver circuit. When the growth direction of each crystal is brought into line with the direction of a current flowing into each thin film transistor built in the silicon film, a mobility of about 300–400 cm$^2$/Vs can be obtained easily.

Further, by irradiation with a power density P3 lower than a threshold value for silicon rods described in FIGS. 3 and 4 and higher than the power density P2, the film quality is improved so that a mobility of 450 cm$^2$/Vs or higher can be obtained. This region is located between the solid line and the broken line as shown by the reference sign A in FIG. 3.

Not to say, by irradiation with a laser beam having a power density P4 which is the threshold value for silicon rods, the silicon film cannot exist as a film, but the silicon film masses (coheres) like stripes due to surface tension, or a part of the silicon film is evaporated or removed to suffer damage. This region is located above the solid line and designated by the reference sign B in FIG. 6.

On the other hand, when the silicon film is irradiated with a laser beam having a power density P1 lower than the power density P2 appropriate for forming a quasi-single crystalline film, the time when the crystals can be fused is shorter than the time when the crystals can grow up laterally. Thus, the formed film is a fine grain poly-crystalline film made from fine crystal grains. In the conditions where a fine grain poly-crystalline film will be formed, the grain size varies in accordance with the power density to irradiate the silicon film. With increase of the power density, a higher mobility can be obtained.

The range of the obtained mobility is about several tens to 200 cm$^2$/V, and a poly-crystalline film having enough performance to be used for switching pixels by way of example can be formed. This region is shown by the reference sign C in FIG. 6. The region C is located between the broken line and the chain line in FIG. 6. The reference sign D designates a region where the silicon film remains amorphous.

Incidentally, in each power density, the silicon film is made poly-crystalline through scanning with the CW laser beam. Accordingly, there is no fear that projections are formed due to collision of crystal grains with one another as in the case where a silicon film is irradiated with a pulsed laser beam to be thereby made poly-crystalline. In the case of the fine grain poly-crystalline film, the surface roughness is about 30 nm at a maximum value Rmax. In the case of the quasi-single crystal film, the surface roughness is not higher than 20 nm at a maximum value Rmax, and it is typically about 10 nm.

Here, the behavior of the amorphous silicon film irradiated with the temporally modulated CW laser beam 4 will be described with reference to FIGS. 7A and 7B. In this embodiment, as described previously, a substrate in which an amorphous silicon thin film 100 has been formed on a glass substrate is used as a subject of annealing.

As shown in FIG. 7A, the amorphous silicon film 100 is scanned with a laser beam 101 condensed linearly so that a region 102 is irradiated therewith. When the power density of the condensed laser beam is P2 in FIG. 6, the amorphous silicon film 100 excluding the laser irradiated region 102 is left as it is, but amorphous silicon in the laser irradiated region 102 is fused. After that, when the laser beam 101 passes over the amorphous silicon film 100, the fused silicon is solidified and recrystallized rapidly. In this event, as schematically shown in FIG. 7B, the silicon begins to be cooled and solidified in a region where the silicon was first fused, and fine crystals 104 having random crystal orientations are formed.

Each fine crystal keeps growing in the scanning direction S of the laser beam, but the growth rate depends on the crystal orientation. Accordingly, crystal grains having a crystal orientation whose growth rate is the highest keep growing. That is, as shown in FIG. 7B, the growth of a crystal grain 105 having a crystal orientation whose growth rate is low is suppressed by the growth of surrounding crystal grains 106 and 107 each having a crystal orientation whose growth rate is higher. Thus, the growth of the crystal grain 105 is stopped. The crystal grain 106 having a crystal orientation whose growth rate is moderate keeps growing, but the growth of the crystal grain 106 is suppressed by the growth of the crystal grains 107 and 108 whose growth rates are higher. Thus, the growth of the crystal grain 106 is stopped soon. Finally, the crystal grains 107 and 108 having a crystal orientation whose growth rate is the highest keep growing.

However, the crystal grains do not grow unlimitedly. When they have grown to be about 10–50 microns long, the growth thereof is suppressed soon by the growth of fresh crystal grains beginning to grow. As a result, crystal grains 0.2–2 μm wide and 5–50 μm long are obtained.

Such crystal grains 107, 108, 109, 110, 111 and 112 going on with their crystal growth to the last are independent crystal grains in the strict sense. However, they have a substantially identical crystal orientation, and their fused and recrystallized portions can be regarded effectively as substantially single crystalline (quasi-single crystalline) In addition, the irregularities in the surface after the annealing are not higher than 10 nm. Thus, the surface is extremely flat. When the amorphous silicon thin film 100 is irradiated with the laser beam 101 in such a manner, a region irradiated with the laser beam is annealed like an island, and only crystal grains having a specific crystal orientation grow up. Thus, there is formed a region which is poly-crystalline in the strict sense but has properties close to single crystalline properties. Particularly in a direction which does not cross any grain boundary, the region may be regarded as substantially single crystalline. In this event, a mobility of 400 $cm^2/Vs$ or higher, typically 450 $cm^2/Vs$, can be obtained as that of the silicon film.

This procedure is repeated while relatively scanning the glass substrate on which the amorphous silicon film 100 has been formed, so that portions to be annealed are irradiated with the laser beam sequentially. Thus, all the regions where thin film transistors should be formed can be transformed into regions having properties close to substantially single crystalline properties. In each region having properties close to single crystalline properties, crystal grains have grown in a fixed direction. Accordingly, when each thin film transistor is formed so that the flowing direction (source-drain direction) of a current is brought into line with the growing direction of the crystal grains, it is possible to prevent the current from flowing across any grain boundary.

To this end, when the thin film transistors are built in, alignment may be performed so that regions (active regions) 130 and 131 surrounded by the broken lines in FIG. 7B become active layers (active regions) of the thin film transistors. Any portion excluding the active regions 130 and 131 is removed through an impurities diffusing step and a photo-etching step. Then, as shown in FIG. 8, a gate electrode 133 put through a gate insulating film (not shown), and a source electrode 164 and a drain electrode 165 having an ohmic connection are formed in a photoresist step. Thus, a transistor is completed.

FIG. 8 shows the case where a thin film transistor has been built in the active region 130 in FIG. 7B. Here, there are some grain boundaries in the active region 130. However, since a current flows between the source electrode 134 and the drain electrode 135, there is no fear that the current cuts across any grain boundary. Thus, mobility substantially equivalent to that of a transistor formed out of a single crystal can be obtained.

As described above, the flowing direction of a current is brought into line with a direction not cutting across any grain boundary in the portion fused and recrystallized by irradiation with the temporally modulated CW solid-state laser beam having the power density P2 described in FIG. 6. Thus, high-performance thin film transistors can be built in. The mobility obtained by this annealing has a value high enough to form a peripheral circuit including a driver circuit for driving liquid crystals at a high speed when this display panel is applied to a liquid crystal display unit by way of example. The thin film transistors can be used for switching pixels if necessary.

Next, with reference to FIG. 9, description will be made on the case where the power density of the condensed laser beam is P1 in FIG. 6. As shown in FIG. 9, an amorphous silicon film is irradiated with a laser beam condensed linearly while a substrate is scanned therewith continuously in the same manner as in FIG. 7A. Then, the amorphous film excluding the laser irradiated regions is left as it is, but amorphous silicon in the laser irradiated regions is fused. After that, when the laser beam passes over the amorphous silicon film, the fused silicon is solidified and recrystallized rapidly. In this event, in the same manner as in FIG. 7B, the silicon begins to be cooled and solidified in a region where the silicon was first fused, and fine grain crystals 144 having random crystal orientations are formed.

Since the power density of the laser beam for irradiation is lower than the aforementioned one P2, there is not enough time for the fused silicon to grow continuously as crystals, and the fused silicon is not left in a fused state. Accordingly, each fine grain crystal 144 stays as it is without growing up further. With relative movement of the laser beam, similar phenomena occur one after another. As a result, the laser irradiated region as shown in FIG. 9 becomes totally a poly-crystalline silicon film composed of fine grain crystals. The size of the fine grain crystals depends on the power density of the laser beam for irradiation, ranging from several tens of nanometers to 1,000 nanometers (1 micron).

By use of the poly-crystalline silicon film composed of fine grain crystals, thin film transistors are built in using parts of the silicon film as active regions 150 and 151. In this case, any portion excluding the active regions 150 and 151 is removed through an impurities diffusing step and a photo-etching step. As shown in FIG. 10, a gate electrode 153 put through a gate insulating film (not shown), and a source electrode 154 and a drain electrode 155 having an ohmic connection are formed in a photoresist step. Thus, a transistor is completed. FIG. 10 shows the case where a thin film transistor is built in the active region 150 in FIG. 9.

The poly-crystal film obtained here has no anisotropy in grain size. Accordingly, there is less necessity to control the source-drain direction when the thin film transistor is formed. In addition, the mobility of the poly-crystalline film obtained by this annealing is about several tens to 200 $cm^2/Vs$. Thus, the poly-crystalline film is short of performance as a transistor for a driver circuit, but it is sufficient as a thin film transistor for switching each pixel formed in the pixel portion.

Embodiment 1 of a method for manufacturing a display unit according to the present invention will be described in consideration of the annealing mechanism described above. In FIG. 11A, of a plurality of display panel parts (typically several tens to several hundreds of panels are formed) to be manufactured out of a large-sized glass substrate, two panels adjacent to each other in the scanning direction of a laser beam are shown representatively. Incidentally, an insulating substrate (glass substrate) forming each display panel will be referred to as "panel" in the following description. A display portion (pixel portion) 171 (171'), a gate driver circuit portion 172 (172'), a drain driver circuit portion 173 (173') and an additional peripheral circuit portion 174 (174') are formed on each panel.

In this embodiment, thin film transistors capable of being driven at a high speed are formed on all of the display portion 171 (171'), the gate driver circuit portion 172 (172'), the drain driver circuit portion 173 (173') and the additional peripheral circuit portion 174 (174'). The glass substrate is scanned with a linearly condensed laser beam relatively in the scanning direction S shown by the arrow. Incidentally, though scanning is generally performed by moving the glass substrate, the laser beam may be moved.

FIGS. 11B and 11C show the power density in each position in the scanning direction of the laser beam, contrasted with the layout of the panels. Incidentally, also see FIG. 6 for the following description. Since the laser beam performs scanning at a fixed speed, any position in the scanning direction of the laser beam can be replaced by time. At the time when the laser beam reaches the left panel of the two panels to be irradiated in FIG. 11A, the power density is set by the EO modulator described in FIG. 1, so as to be zero or low enough not to cause any change in the crystal state of the amorphous silicon film.

When the laser beam approaches the gate driver circuit portion 172, a voltage is applied to the EO modulator so as to set the power density at P2. Thus, the laser beam having the power density P2 starts annealing. The power density P2 is high enough to grown fused silicon in the width direction (laterally) with respect to the scanning direction of the laser beam. The power density P2 is kept even after the laser beam passing through the gate driver circuit portion 172 enters the pixel portion 171. As soon as the laser beam passes over the pixel portion 171, the power density is set by the EO modulator so as to be zero or low enough not to cause any change in the amorphous silicon film.

In this state, the laser beam passes over the left panel and enters the right panel. When the laser beam approaches the gate driver circuit portion 1721 of the right panel, a voltage is applied to the EO modulator so as to set the power density at P2. Thus, the laser beam having the power density P2 starts annealing. The power density P2 is kept even after the laser beam passing through the gate driver circuit portion 172' enters the pixel portion 171'. As soon as the laser beam passes over the pixel portion 171', the power density is set by the EO modulator so as to be zero or low enough not to cause any change in the amorphous silicon film. When the laser beam completes the laser irradiation including the additional peripheral circuit portions 174 and 174' and the drain driver circuit portions 173 and 173' as shown in FIG. 11A, the laser beam moves relatively in a direction perpendicular to the scanning direction and starts irradiation for a subsequent panel line. In FIG. 11A–11C, it is assumed that one panel as a whole is annealed by 11 scans. However, the number of scans depends on the output of the CW laser and the size of the panel.

Although FIGS. 11A and 11B show annealing in a fixed direction along the scanning direction S of the laser beam, annealing may be carried out by reciprocating scans. While annealing in a fixed direction is advantageous in setting the irradiated position accurately, reciprocating annealing is advantageous in throughput.

Although scanning is described on the assumption that each panel is scanned with the laser beam always ON during one scan, irradiation may be performed with a laser beam turned ON/OFF repeatedly in a fixed or desired period as shown in FIG. 11C. In this case, not to say, positioning is done so that annealed regions each having a width of several hundreds of micrometers to several millimeters and non-annealed regions each having a width of 5 μm to 10 μm are repeated, while thin transistors in a pixel region and thin transistors in a peripheral circuit portion are formed in the annealed regions.

The above operation is repeated while the whole surface of the glass substrate is scanned, and annealing is terminated. Thus, the amorphous silicon film in the pixel portion, the gate driver circuit portion and the drain driver circuit portion (including the additional peripheral circuit portion) irradiated with the power density P2 is transformed into a poly-crystalline silicon (quasi-single crystalline silicon) film having a mobility of 300 to 400 $cm^2/Vs$.

According to this embodiment, annealing is performed to provide performance corresponding to required performance of a silicon film forming thin film transistors in each region including a region where switching thin film transistors for forming a pixel portion should be formed, a region where a peripheral circuit including a driver circuit should be formed, and so on. Thus, it is possible to manufacture display panels at a high yield rate.

According to Embodiment 1, the manufacturing yield of display panels is improved while it is possible to provide display panels in which a poly-crystalline silicon film having no projection causing the lowering of voltage durability is formed in accordance with performance required for various circuits to be formed on an insulating substrate.

[Embodiment 2]

Figure 12:
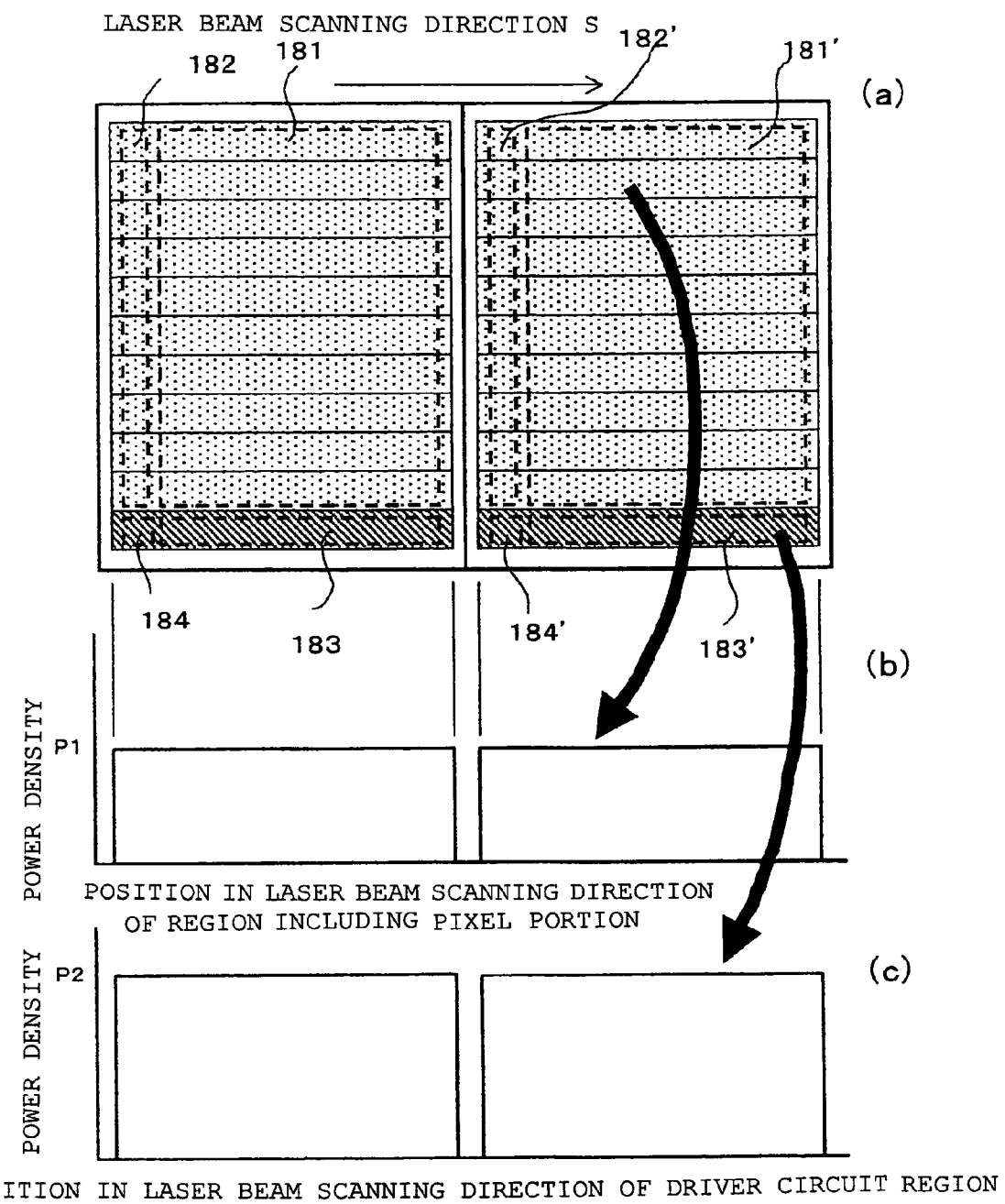
FIGS. 12A–12C are explanatory views showing the relationship between the stage movement and the power density of a laser beam for irradiation, for explaining Embodiment 2 of a method for manufacturing a display panel according to the present invention.

FIGS. 12A–12C are explanatory views showing the relationship between the stage movement and the power density of a laser beam for irradiation, for explaining Embodiment 2 of a method for manufacturing a display panel according to the present invention. See FIGS. 1 and 6 also for this description. In FIG. 12A, of a plurality of panels (typically several tens to several hundreds of panels are formed) to be formed out of a large-sized glass substrate, two panels adjacent to each other are shown representatively in the same manner as in Embodiment 1. Incidentally, an insulating substrate (glass substrate) forming each display panel will be referred to as "panel" here in the same manner as in Embodiment 1. A display portion (pixel portion) 181 (181'), a gate driver circuit portion 182 (182'), a drain driver circuit portion 183 (183') and an additional peripheral circuit portion 184 (184') are formed on each panel.

In this embodiment, a fine grain poly-crystalline film unnecessary to be driven at a high speed is formed in the pixel portion 181 (181') and the gate driver circuit portion 182 (182'), while a quasi-single crystalline film for forming transistors capable of being driven at a high speed is formed on all of the drain driver circuit portion 183 (183') and the additional peripheral circuit portion 184 (184'). The glass substrate is scanned with a linearly condensed laser beam relatively in the scanning direction S shown by the arrow. Incidentally, though scanning with the laser beam is generally performed by moving the glass substrate, the laser beam may be moved.

FIGS. 12B and 12C show the power density in each position in the scanning direction of the laser beam, contrasted with the layout of the panels. Here, since the laser beam performs scanning at a fixed speed, any position in the scanning direction of the laser beam can be replaced by time. At the time when the laser beam reaches the left panel of the two adjacent panels to be irradiated in FIG. 12A, the power density is set by the EO modulator so as to be zero or low enough not to cause any change in the amorphous silicon film. When the laser beam approaches the gate driver circuit portion 182, a voltage is applied to the EO modulator so as to set the power density at P1. Thus, the laser beam having the power density P1 starts annealing.

As described in FIG. 6, the power density P1 is a power density not high enough to grow the fused silicon in the width direction (laterally) with respect to the scanning direction of the laser beam. Due to irradiation with this power density, a fine grain poly-crystalline film is formed. The power density P1 is kept even after the laser beam passing through the gate driver circuit portion 182 enters the pixel portion 181. As soon as the laser beam passes over the pixel portion, the power density is set by the EO modulator so as to be zero or low enough not to cause any change in the amorphous silicon film.

In this state, the laser beam passes over the left panel and enters the right panel. When the laser beam approaches the gate driver circuit portion 182', a voltage is applied to the EO modulator so as to set the power density at P1. Thus, the laser beam having the power density P1 starts annealing. The power density P1 shown in FIG. 12B is kept even after the laser beam passing through the gate driver circuit portion 182' enters the pixel portion 181'. As soon as the laser beam passes over the pixel portion 181', the power density is set by the EO modulator so as to be zero or low enough not to cause any change in the amorphous silicon film.

As shown in FIG. 12A, when the laser beam enters a region where the additional peripheral circuit portion 184' and the drain driver circuit portion 183' should be formed, the power density is set at P2 by the EO modulator. When the additional peripheral circuit portion 184' and the drain driver circuit portion 183' are being irradiated with the laser beam, the power density thereof is kept at P2 as shown in FIG. 12C. When laser irradiation of the left panel is completed, the power density is set by the EO modulator so as to be zero or low enough not to cause any change in the amorphous silicon film.

When the laser beam enters the right panel and approaches the drain driver circuit portion 182', a voltage is applied to the EO modulator so as to set the power density at P2. Thus, the laser beam having the power density P2 starts annealing. The power density P2 is a power density high enough to grow the fused silicon in the width direction (laterally) with respect to the scanning direction of the laser beam. As soon as the laser beam passes over the drain driver circuit portion 182', the power density is set by the EO modulator so as to be zero or low enough not to cause any change in the amorphous silicon film. When a line of a plurality of panels on the large-sized glass substrate have been annealed, the laser beam moves relatively in a direction perpendicular to the scanning direction S, and starts irradiation on a subsequent line of a plurality of panels.

Also in FIG. 12A, it is assumed that one panel as a whole is annealed by 11 scans. However, the number of scans depends on the output of the CW laser and the size of the panel. Incidentally, FIGS. 12A to 12C also show annealing in a fixed direction. However, annealing may be carried out by reciprocating scans. While annealing in a fixed direction is advantageous in setting the irradiated position accurately, reciprocating annealing is advantageous in throughput.

Also in this embodiment, scanning is described on the assumption that each panel is scanned with the laser beam always ON during one scan. However, irradiation may be performed with a laser beam turned ON/OFF repeatedly as shown in FIG. 1C. In this case, not to say, positioning has to be done so that thin film transistors in a pixel region and thin film transistors in a peripheral circuit portion are formed in annealed regions.

The above operation is repeated while the whole surface of the glass substrate is scanned, and annealing is terminated. Thus, the amorphous silicon film in the gate driver circuit portion and the pixel portion irradiated with the power density P1 is transformed into a poly-crystalline silicon film having a mobility of 10 to 200 $cm^2$/Vs, while the amorphous silicon film in the drain driver circuit portion is transformed into a poly-crystalline silicon film having a mobility of 300 to 400 $cm^2$/Vs.

Also according to this embodiment, annealing is performed to provide performance corresponding to required performance of a silicon film forming thin film transistors in each region including a region where switching thin film transistors for forming a pixel portion should be formed, a region where a peripheral circuit including a driver circuit should be formed, and so on. Thus, it is possible to manufacture display panels at a high yield rate.

[Embodiment 3]

Figure 13:
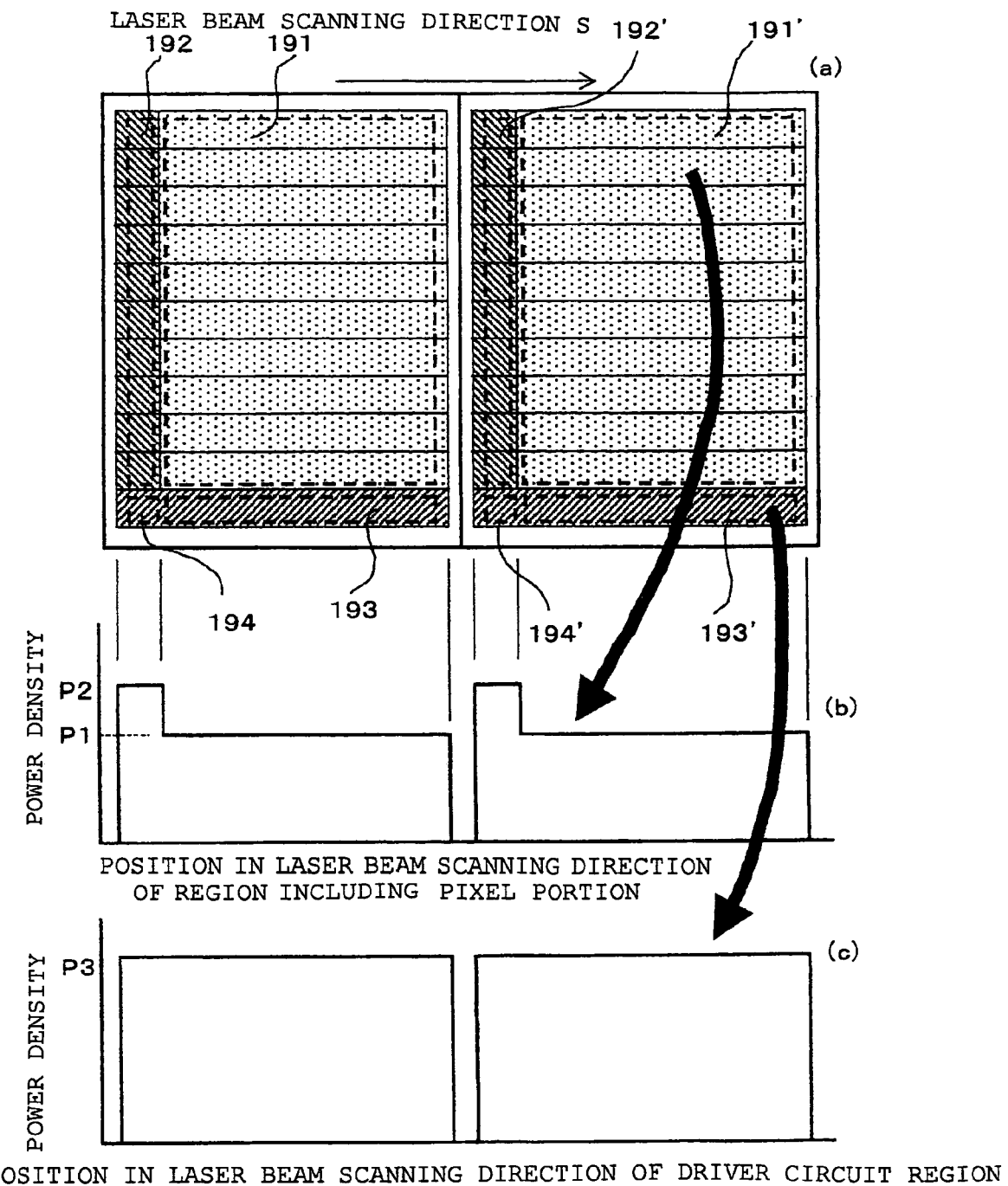
FIGS. 13A–13C are explanatory views showing the relationship between the stage movement and the power density of a laser beam for irradiation, for explaining Embodiment 3 of a method for manufacturing a display panel according to the present invention.

FIGS. 13A–13C are explanatory views showing the relationship between the stage movement and the power density of a laser beam for irradiation, for explaining Embodiment 3 of a method for manufacturing a display panel according to the present invention. See FIGS. 1 and 6 also for this description. In FIGS. 13A–13C, of a plurality of panels (typically several tens to several hundreds of panels are formed) to be formed out of a large-sized glass substrate, two panels adjacent to each other are shown representatively in the same manner as in Embodiment 2. The meaning of the word "panel" is similar to that in the aforementioned embodiments. In FIG. 13A, a display portion (pixel portion) 191 (191'), a gate driver circuit portion 192 (192'), a drain driver circuit portion 193 (193') and an additional peripheral circuit portion 194 (194') are formed on each panel.

In this embodiment, a fine grain poly-crystalline film unnecessary to be driven at a high speed is formed in the pixel portion 191 (191'), while a quasi-single crystalline film for forming transistors capable of being driven at a high speed is formed on the gate driver circuit portion 192 (192'), the drain driver circuit portion 193 (193') and the additional peripheral circuit portion 194 (194'). The glass substrate is scanned with a linearly condensed laser beam relatively in the direction S shown by the arrow. Incidentally, though scanning is generally performed by moving the glass substrate, the laser beam may be moved.

FIGS. 13B and 13C show the power density in each position in the scanning direction of the laser beam, contrasted with the layout of the panels. Here, since the laser beam performs scanning at a fixed speed, any position in the scanning direction of the laser beam can be replaced by time. At the time when the laser beam reaches the left one of the two adjacent panels to be irradiated therewith, the power density is set by the EO modulator so as to be zero or low enough not to cause any change in the amorphous silicon film. When the laser beam approaches the gate driver circuit portion 192, a voltage is applied to the EO modulator so as to set the power density at P2. Thus, the laser beam having the power density P2 starts annealing. The power density P2 is a power density high enough to grow the fused silicon in the width direction (laterally) with respect to the scanning direction of the laser beam. Thus, a high-mobility quasi-single crystalline film can be obtained. As soon as the laser beam passes over the gate driver circuit portion 192, the power density is set at P1 by the EO modulator.

The laser beam entering the pixel portion 191 is kept having the power density P1. As soon as the laser beam passes over the pixel portion 191, the power density is set by the EO modulator so as to be zero or low enough not to cause any change in the amorphous silicon film. The power density P1 is a power density not high enough to grow the fused silicon in the width direction (laterally) with respect to the scanning direction of the laser beam. Thus, due to irradiation with this power density, a fine grain poly-crystalline film is formed.

When the laser beam passing over the left panel and entering the right panel approaches the gate driver circuit portion 192', a voltage is applied to the EO modulator so as to set the power density at P2. Thus, the laser beam having the power density P2 starts annealing. Consequently, silicon grows up laterally in the region irradiated with the power density P2. Thus, a quasi-single crystalline film is formed. As soon as the laser beam passes over the gate driver circuit portion 192', the power density is set at P1 by the EO modulator. The laser beam entering the pixel portion 191' is kept having the power density P1. Thus, a fine grain poly-crystalline film is formed. As soon as the laser beam passes over the pixel portion 191', the power density is set by the EO modulator so as to be zero or low enough not to cause any change in the amorphous silicon film.

As shown in FIG. 13C, when the laser beam enters a region where the additional peripheral circuit portion 194 and the drain driver circuit portion 193 (193') should be formed, the power density is set at P3 by the EO modulator. Here, the power density P3 has a larger value that that of the power density P2. Crystal grains obtained in a region irradiated with the power density P3 are larger than those in a region irradiated with the power density P2. Thus, a quasi-single crystalline film suitable for forming a higher speed circuit is formed. The power density of the laser beam is kept at P3 when the additional peripheral circuit portion 194 (194') and the drain driver circuit portion 193 (193') are being irradiated with the laser beam.

When laser irradiation of the left panel is completed, the power density is set by the EO modulator so as to be zero or low enough not to cause any change in the amorphous silicon film. When the laser beam entering the right panel enters a region where the additional peripheral circuit portion 194' and the drain driver circuit portion 193' should be formed, the power density is set at P3 by the EO modulator. The power density of the laser beam is kept at P3 when the additional peripheral circuit portion 194' and the drain driver circuit portion 193' are being irradiated with the laser beam. When laser irradiation of the right panel is completed, the power density is set by the EO modulator so as to be zero or low enough not to cause any change in the amorphous silicon film.

When a line of a plurality of panels have been annealed, the laser beam moves relatively in a direction perpendicular to the scanning direction S, and starts irradiation on a subsequent line of a plurality of panels. Incidentally, also in FIG. 13A, it is assumed that one panel as a whole is annealed by 11 scans. However, the number of scans depends on the output of the CW laser and the size of the panel. Incidentally, FIGS. 13A–13C also show annealing in a fixed direction. However, annealing may be carried out by reciprocating scans. While annealing in a fixed direction is advantageous in setting the irradiated position accurately, reciprocating annealing is advantageous in throughput.

Also in this embodiment, scanning is described on the assumption that each panel is scanned with the laser beam always ON during one scan. However, irradiation may be performed on each panel with a laser beam turned ON/OFF repeatedly as described with reference to FIG. 11C. In this case, not to say, positioning has to be done so that thin film transistors in a pixel portion and thin film transistors in a peripheral circuit portion are formed in annealed regions.

Although description has been made on the assumption that the power density P3 is higher than the power density P2, the power density P2 may be set to be equal to the power density P3 or to be higher than the power density P3 for some reason on circuit design.

The above operation is repeated while the whole surface of the substrate is scanned, and annealing is terminated. Thus, the amorphous silicon film in the pixel portion irradiated with the power density P1 is transformed into a fine grain poly-crystalline silicon film having a mobility of 10 to 200 $cm^2$/Vs, while the amorphous silicon film in the gate driver circuit portion is transformed into a poly-crystalline (quasi-single crystalline) silicon film having a mobility of 300 to 400 $cm^2$/Vs. Further, the amorphous silicon film in the additional peripheral circuit portion and the drain driver circuit portion is transformed into a poly-crystalline (quasi-single crystalline) silicon film having a mobility of at least 400 $cm^2$/Vs, typically about 450 $cm^2$/Vs.

Figure 14:
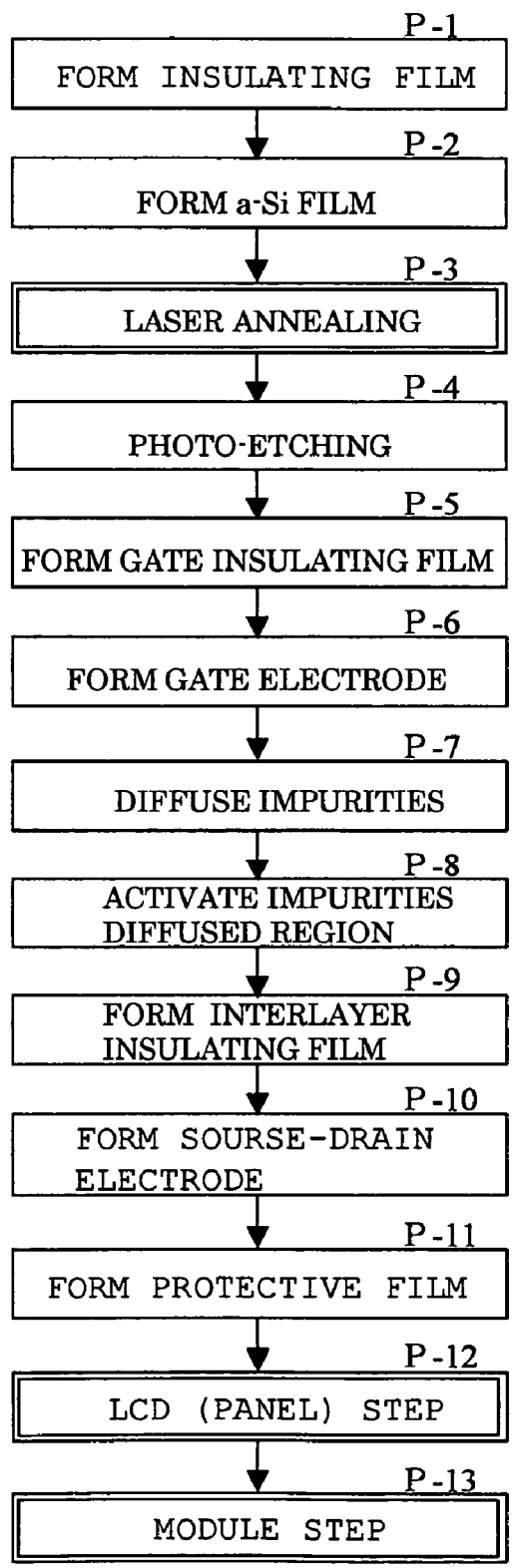
FIG. 14 is an explanatory diagram for explaining a process for manufacturing a liquid crystal display (LCD) panel as a display panel to which the present invention is applied.
Figure 15:
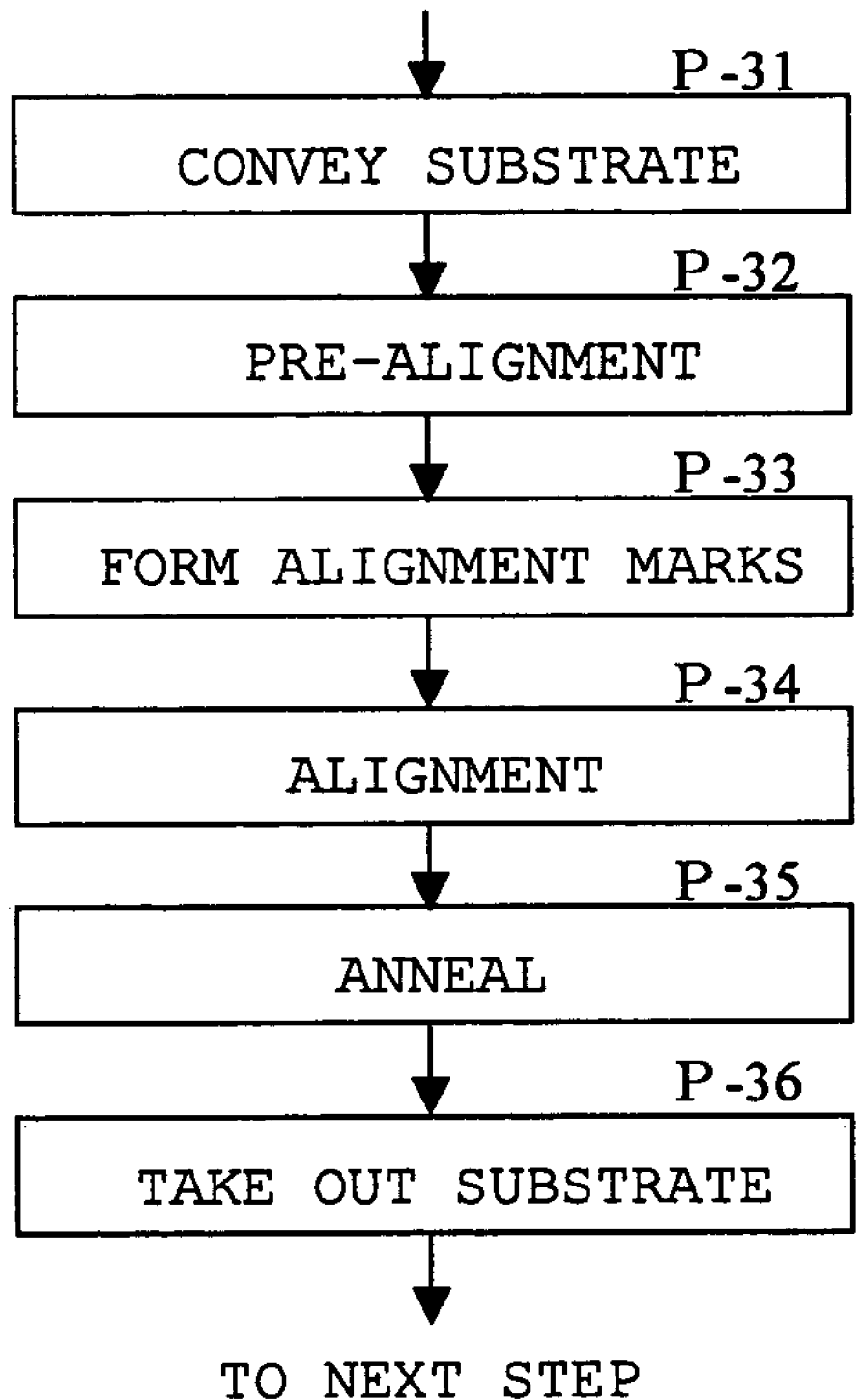
FIG. 15 is an explanatory diagram for explaining a laser annealing step which is a part of the manufacturing process described in FIG. 14.
Figure 16:
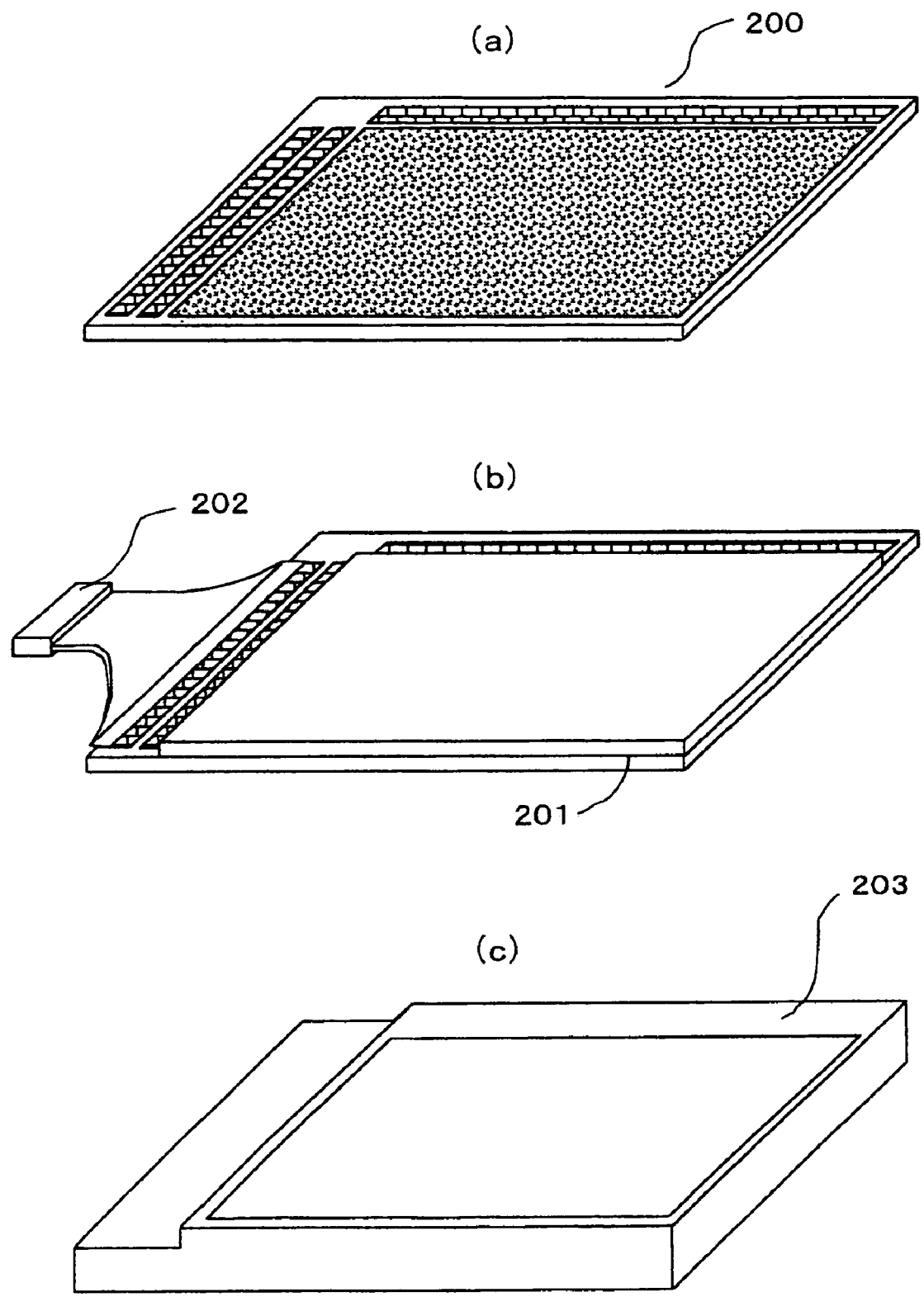
FIGS. 16A–16C are perspective views for explaining an LCD (panel) step and a module step of the manufacturing process described in FIG. 14.

Here, a process for manufacturing a display panel including the aforementioned annealing step will be described with reference to FIGS. 14 and 15. FIG. 14 is an explanatory diagram of a process for manufacturing a liquid crystal display (LCD) panel as a display panel the present invention is applied to. FIG. 15 is an explanatory diagram of a laser annealing step in FIG. 14. FIGS. 16A–16C are perspective views for explaining an LCD (panel) step and a module step in FIG. 14. As shown in FIG. 14, first, an insulating film of $SiO_2$ and/or SiN, or the like, is formed on a glass substrate (P-1). An amorphous silicon (a-Si) film is formed thereon (P-2), and laser annealing is performed (P-3).

In the laser annealing according to the present invention, as shown in FIG. 15, the glass substrate is conveyed into an annealing chamber (P-31) and subjected to pre-alignment (P-32), whereupon an alignment mark is formed (P-33). The alignment mark may be formed by a laser for annealing or by means of ink-jet or the like. Alternatively, the alignment mark may be formed in a photo-etching step in advance. In that case, the step (P-33) is dispensable here.

The glass substrate is mounted on the stage 9 of the laser annealing apparatus described in FIG. 1, and aligned with the scanning position of a laser beam by means of the formed alignment marks (P-34). According to the aforementioned embodiments, a pixel portion and a peripheral circuit portion are annealed by irradiation with a CW solid-state laser beam modulated temporally, so that intended crystals are grown up in each portion (P-35). When required annealing is terminated, the substrate is conveyed out of the laser annealing apparatus, and sent to the next step (P-36). Here, return to FIG. 14.

After the laser annealing, only parts of the silicon film required for forming transistors are left by the photo-etching step (P-4), and a thin film transistor substrate (TFT substrate) is completed through gate insulating film formation (P-5), gate electrode formation (P-6), impurities diffusion (P-7), activation (P-8), interlayer insulating film formation (P-9), source/drain electrode formation (P-10) and protective film (passivation film) formation (P-11).

After that, an orientation film is formed on the TFT substrate shown in FIG. 16A, and a TFT substrate 200 is obtained through a rubbing step. As shown in FIG. 16B, a color filter substrate 201 is put on top of the TFT substrate 200, and an LCD (panel) step (P-12) is carried out. In the LCD (panel) step (P-12), liquid crystals are charged between the TFT substrate 200 and the color filter substrate 201. After a signal and power supply terminal 202 is connected, a module step (P-13) is carried out as shown in FIG. 16C. In the module step (P-13), the TFT substrate 200 with the color filter substrate 201 is incorporated in a chassis 203 together with a backlight (not shown) and so on. Thus, a liquid crystal display unit (a liquid crystal display unit using a so-called system-on panel) in which a high speed drive circuit and a high speed circuit such as an interface circuit if necessary have been formed on a glass substrate is completed.

Figure 17:
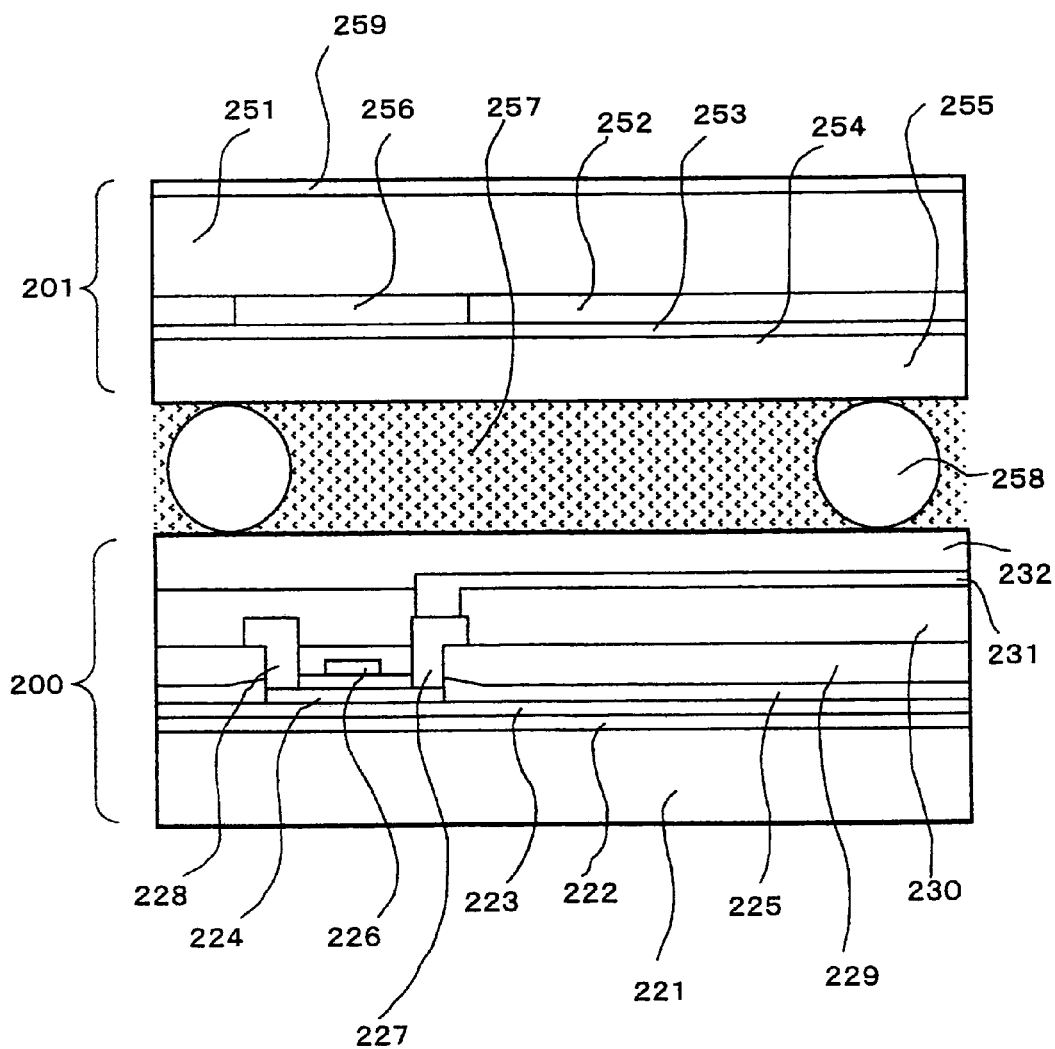
FIG. 17 is a main portion sectional view showing the vicinity of a pixel in a pixel portion, for explaining an example of the structure of the liquid crystal display panel.

FIG. 17 is a main portion sectional view of the vicinity of one pixel in a pixel portion, for explaining an example of the structure of the liquid crystal display panel. In the liquid display panel, liquid crystals 257 have been charged into a gap between the TFT substrate 200 and the CF substrate (color filter substrate) 201 put on top of each other to be stuck to each other. In the TFT substrate 200, an active layer of a thin film transistor formed on a glass substrate 221 through an insulating film comprised of an SiN film 222 and an $SiO_2$ film 223 is formed out of a silicon film 224 into which the amorphous silicon film is transformed by annealing with a solid-state pulsed laser according to the present invention.

A gate electrode 226 is formed through a gate insulating film 225, and a source electrode 227 and a drain electrode 228 each having an ohmic connection with the silicon film 224 are formed on an interlayer insulating film 229 through a through hole. In addition, a transparent pixel electrode 231 is formed on a protective film (passivation film) 230 so as to be connected to the source electrode 227 through a through hole, and an orientation film 232 is formed on the transparent pixel electrode 231 so as to cover the whole surface thereof.

On the other hand, in the CF substrate 201, a color filter layer 252 comprised of layers of three colors R (red), G (green) and B (blue) is formed on a glass substrate 251. A transparent electrode 254 is formed thereon through a protective film 253, and an orientation film 255 is formed thereon. A black layer (black matrix layer 256) may be provided in each boundary portion between adjacent layers of the colors R, G and B in the color filter layer 252 in accordance with necessity. Alternatively, the black matrix layer may be provided between the color filter layer 252 and the glass substrate 251 so as to have an opening to the pixel portion.

Liquid crystals 257 are charged between the TFT substrate and the CF substrate while beads 258 are used to retain a fixed distance therebetween. Instead of the beads 258, spacers called column spacers or columnar spacers may be formed fixedly on the TFT substrate side or on the color filter substrate side. A polarizer 259 is pasted to the outside of the CF substrate 201 and/or the outside of the TFT substrate 200. FIG. 17 shows the state where the polarizer 259 has been pasted to only the outside of the CF substrate 201.

Figure 18:
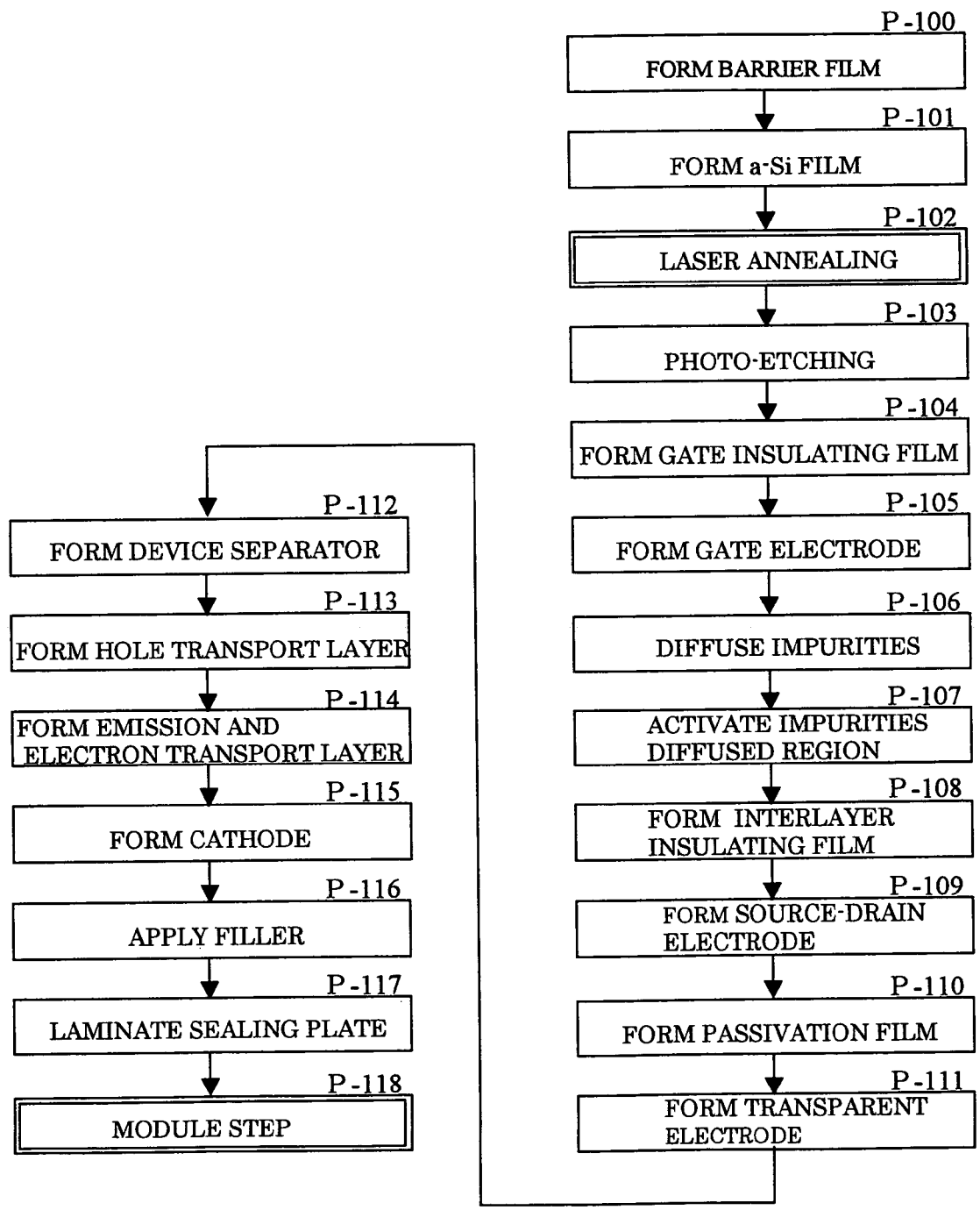
FIG. 18 is an explanatory diagram of a manufacturing process, showing a process for manufacturing an organic electroluminescence display panel.
Figure 19:
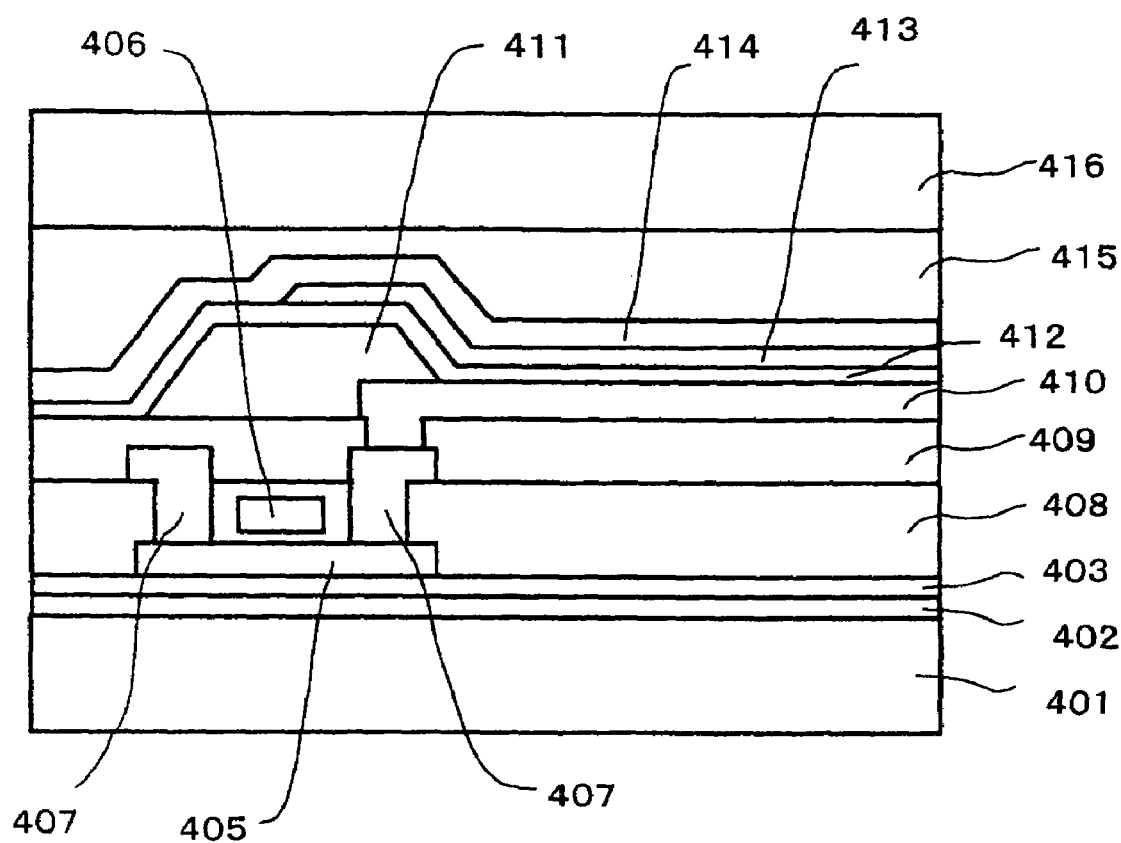
FIG. 19 is a main portion sectional view showing the vicinity of a pixel in a pixel portion, for explaining an example of the structure of the completed organic electroluminescence display panel.

Next, description will be made on a process for manufacturing a display unit using an organic electroluminescence (EL) display panel. Incidentally, organic electroluminescence will be also referred to as "organic EL". FIG. 18 is an explanatory diagram of the process for manufacturing an organic EL display panel. In addition, FIG. 19 is a main portion sectional view of the vicinity of one pixel in a pixel portion, for explaining an example of the structure of the completed organic EL display panel.

In the organic EL display panel, an SiN film 402 and an SiO film 403 having a function as a barrier film are deposited to be thin on a glass substrate 401 by means of CVD or the like (P-100), and an a-Si film (amorphous silicon film) 404 is deposited thereon to be about 50 nm thick by a CVD method (P-101). The layer configuration of the barrier film, the film thickness thereof, the film thickness of the silicon film, and so on, are described here by way of example. It should be noted that such description has no restriction on the present invention.

After that, laser annealing is performed by irradiation with a continuous-wave solid-state laser beam modulated temporally as described previously (P-102). Thus, the amorphous silicon film corresponding to a portion where a pixel circuit should be formed and a portion where a driver circuit should be formed is transformed into a poly-crystalline film (polysilicon film) 405. This laser annealing is similar to that in the aforementioned process of the TFT substrate.

The transformed silicon film 405 formed thus is photo-etched to have an island shape to form predetermined circuits (P-103), and subjected to formation of agate insulating film (not shown) (P-104) and formation of a gate electrode 406 (P-105). Then, the silicon film 405 is subjected to impurities diffusion based on ion implantation (P-106), activation annealing on the impurities diffused region (P-107), formation of an interlayer insulating film 408 (P-108), formation of a source/drain electrode 407 (P-109), formation of a passivation film 409 (P-110) and formation of a transparent electrode 410 (P-111). Thus, a TFT substrate as an active matrix substrate in which a thin film transistor circuit has been disposed in a pixel portion is formed.

The number of transistors in a unit pixel circuit required for driving an organic EL panel is 2 to 5. An optimal circuit configuration having a combination of the pixel circuit and thin film transistors may be used. For example, a low-current driver circuit formed out of a CMOS circuit is recommended as an example of such a circuit. The details of such a low-current driver circuit formed out of a CMOS circuit and a processing technique involved in the formation of electrodes thereof are known well to those skilled in the art. In addition, it is also known well that it is necessary to add steps such as ion implantation and activation annealing halfway in the process for manufacturing the transistor circuit.

Next, a device separator 411 for separating each pixel is formed in a peripheral portion of the transparent element 410 on the TFT substrate (P-112). The device separator 411 is required to have insulation performance. Organic materials such as polyimide may be used for the device separator 411, or inorganic materials such as $SiO_2$ or SiN may be used. A technique for forming the device separator 411 into a film and patterning the device separator 411 is also known well to those skilled in the art.

Next, as for an organic EL material, formation of a hole transport layer 412 (P-113), formation of an emission and electron transport layer 413 (P-114) and formation of a cathode 414 are performed on the transparent electrode 410 sequentially. In this formation, it is also known well to those skilled in the art that a multi-color display can be formed by forming emission and electron transport layers 413 having different emission colors only on specific transparent electrodes 410 by use of a mask for evaporation.

Then, only the pixel portion is coated with a filler 415 by means of screen printing or the like (P-116), a sealing cap or a sealing plate is laminated on the filler 415 (P-116). Thus, sealing is completed. After that, an organic EL display unit is completed through a module step for receiving the organic EL display panel in a housing in accordance with necessity.

Not only is the present invention effective in a so-called low-molecular type organic EL display panel in which an organic layer is formed by vacuum deposition in the aforementioned manner, but it is also effective in a so-called polymer type organic EL display panel. Further, not only is the present invention effective in manufacturing a so-called bottom emission type organic EL in which a transparent electrode, various organic layers forming emission layers, and a cathode are laminated sequentially on a glass substrate as described previously so as to couple out EL emission to the glass substrate side, but it is also effective in manufacturing a so-called top emission type organic EL in which a cathode, various organic layers forming emission layers, and a transparent electrode are laminated sequentially on a glass substrate so as to couple out EL emission to the sealing substrate side.

Also according to this embodiment, annealing is performed to provide performance corresponding to required performance of a silicon film forming thin film transistors in each region including a region where switching thin film transistors for forming a pixel portion should be formed, a region where a peripheral circuit including a driver circuit should be formed, and so on. Thus, it is possible to manufacture display panels at a high yield rate.

[Embodiment 4]

Further, description will be made on another embodiment of the present invention. This embodiment is different from each of the aforementioned embodiments in that a diffracted optical element disposed in an optics is replaced to shape a laser beam. This embodiment will be described below as to a manufacturing method including a laser annealing step.

Figure 20:
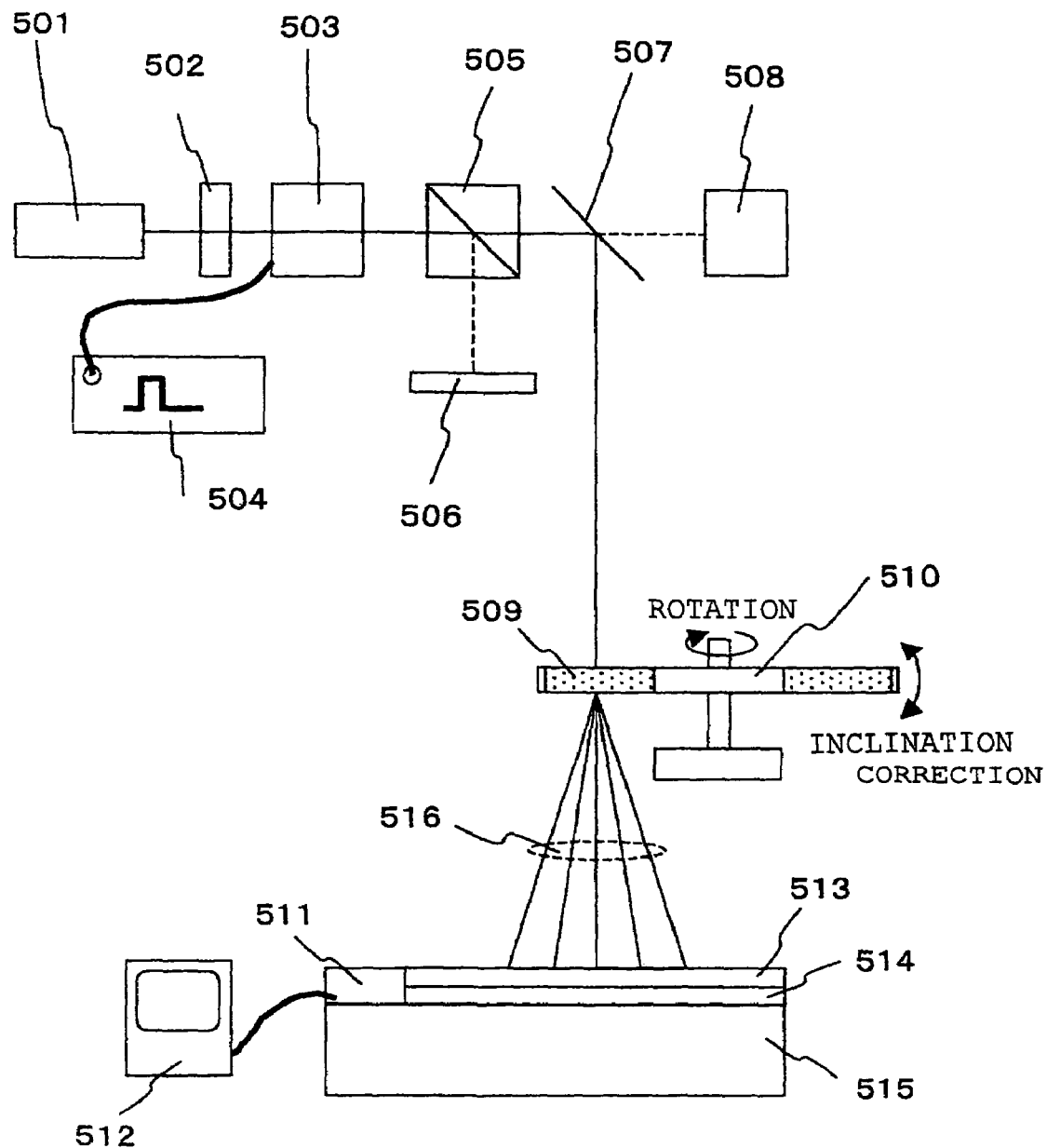
FIG. 20 is a configuration view of a laser annealing apparatus for explaining Embodiment 4 of a method for manufacturing a display panel according to the present invention.

FIG. 20 is a configuration view of a laser annealing apparatus for explaining Embodiment 4 of a method for manufacturing a display panel according to the present invention. The laser annealing apparatus is constituted by a continuous-wave laser oscillator 501, an energy adjustment mechanism (ND filter) 502 for adjusting the output of a continuous-wave laser beam, an EO modulator 503 for temporally modulating the continuous-wave laser beam, a pulse generator 504 for sending a desired temporal waveform pulse to the modulator 503, a polarized beam splitter 505 for coupling out a beam changed in direction of polarization, a beam damper 506 for catching a beam deflected from an optical axis, an optical axis alignment mirror 507, a laser beam output monitor 508, a diffracted optical element 509 serving to shape the beam, a diffracted optical element retention/adjustment mechanism 510 retaining the diffracted optical element and having a rotation/inclination adjustment mechanism, a beam profiler 511 and a monitor 512 for observing the beam shape after the shaping, an XYZ stage 515 for fixing and scanning a glass substrate 514 having an amorphous semiconductor film 513 deposited thereon, and so on.

The output of a laser beam oscillated from the LD pumped solid-state laser 501 is adjusted by the ND filter 502. The EO modulator 503 constituted by a Pockels cell and a polarized beam splitter is controlled by a signal from the pulse generator or controlled by feedback of a count of a linear scale in the same manner as in the aforementioned embodiments. The output is monitored by always monitoring leakage light from the optical axis alignment mirror 507 by means of the laser beam output monitor 508 constituted by a photodiode or a power meter. When there occurs a fluctuation in the output, feedback is applied to the ND filter 502 so as to retain the predetermined output. Thus, the ND filter 502 is controlled to automatically adjust the transmittance.

Figure 21:
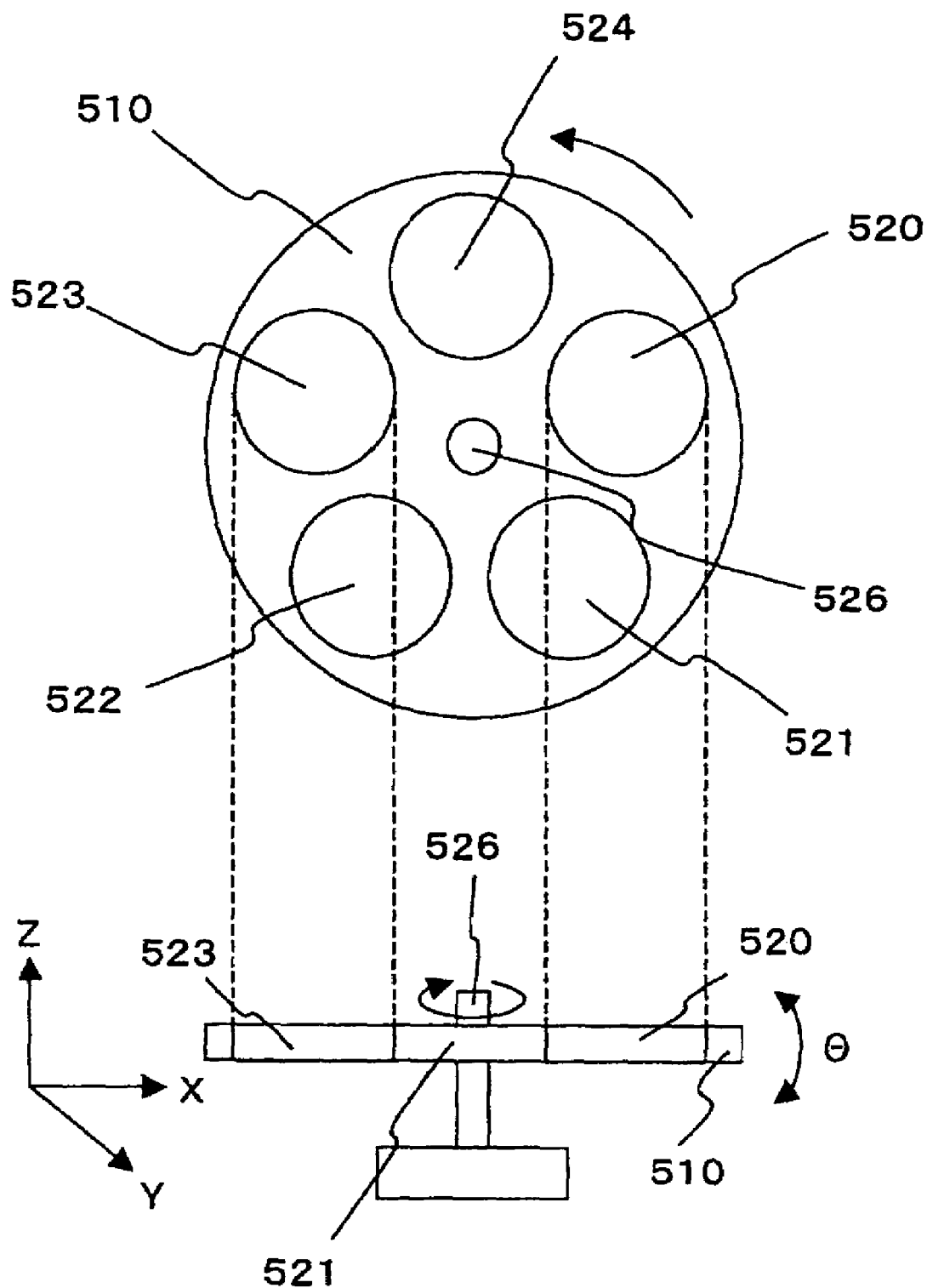
FIG. 21 is a configuration view of a beam shaping element portion using a diffracted optical element.

FIG. 21 is a configuration view of a beam shaping element portion using diffracted optical elements. The diffracted optical elements mean optical elements in which a stepped pattern as long as the wavelength of visible light is built on a transparent flat substrate in a photo-lithographic step so that of diffracted light generated when light is allowed to pass through the stepped pattern, only zero-order diffracted light is coupled out, divided and condensed to form a laser condensed pattern having a desired number of divided parts, a desired intensity distribution and a desired shape on a desired projection plane. Such diffracted optical elements are chiefly used in the field of laser machining. The diffracted optical elements are elements capable of setting the coupling-out efficiency of zero-order diffracted light to be very high to be not lower than 90%, so that the energy of a laser beam can be coupled out efficiently in comparison with a multi-lens array system (fly-eye system) used in an optics for shaping a laser beam short in coherent length (low in coherence) such as an excimer laser beam, or the like.

In addition, since this system shapes a laser beam by use of diffraction of light, there is an advantage that it can be also applied to an optics for shaping a laser beam such as a solid-state laser beam whose coherent length is too long (whose coherence is too high) to be shaped in background-art laser beam shaping techniques such as a multi-lens array system and a fly-eye system as described above. Further, since this system shapes a laser beam by use of a single element, it is more advantageous than the aforementioned two systems in the background art in terms of easiness in maintenance of an optics.

In this system, laser annealing is performed using a plurality of such diffracted optical elements 509. Specifically, a plurality of diffracted optical elements for shaping a laser beam into different widths and power densities or a plurality of diffracted optical elements 509 (description will be made below on the assumption that the diffracted optical elements are comprised of diffracted optical elements 520, 521, 522, 523 and 524) for dividing and shaping a laser beam into a plurality of parts are fixed to the diffracted optical element retention/adjustment mechanism 510. The diffracted optical element retention/adjustment mechanism 510 has a function of rotating like a revolver around an element rotating mechanism 526, for example, as shown by the arrow.

The spatial profile of a laser beam shaped by each of the plural diffracted optical elements 520, 521, 522, 523 and 524 reacts very sensitively to the position of the beam incident on the diffracted optical element body. Therefore, the diffracted optical element retention/adjustment mechanism 510 has a control mechanism (not shown) for controlling the positions of length, width and height (X, Y and Z) and the inclination E in order to correct a positional displacement occurring when any one of the plural diffracted optical elements is replaced. The beam profile on the XYZ stage 515 is monitored by the beam profiler 511 and the monitor 512 in FIG. 20 so as to make control to correct the XYZ positions of the diffracted optical elements and the inclination thereof with respect to the optical axis of irradiation with the laser beam.

Incidentally, this embodiment is illustrated by an example in which the plurality of diffracted optical elements 520, 521, 522, 523 and 524 are arranged rotatably. However, a plurality of diffracted optical elements arranged in a single horizontal line are attached to the diffracted optical element retention/adjustment mechanism 510 so as to form an optics in which a desired diffracted optical element is replaced by sliding.

In FIG. 20, a laser beam 516 shaped into a desired rectangular shape by the diffracted optical elements 509 (520, 521, 522, 523 and 524) is radiated on the amorphous silicon film 513 formed on the glass substrate 514. An automatic focusing optics and a sample surface observing optics to be used for irradiating the glass substrate 514 with the laser beam 516 are similar to those in the embodiment described in FIG. 1. Although the objective lens 11 is used to share one and the same optics between a sample surface observing optics and a laser beam irradiation optics in the embodiment of FIG. 1, the observation optics using the objective lens 11 and the laser beam irradiation optics may be provided independently.

Figure 22:
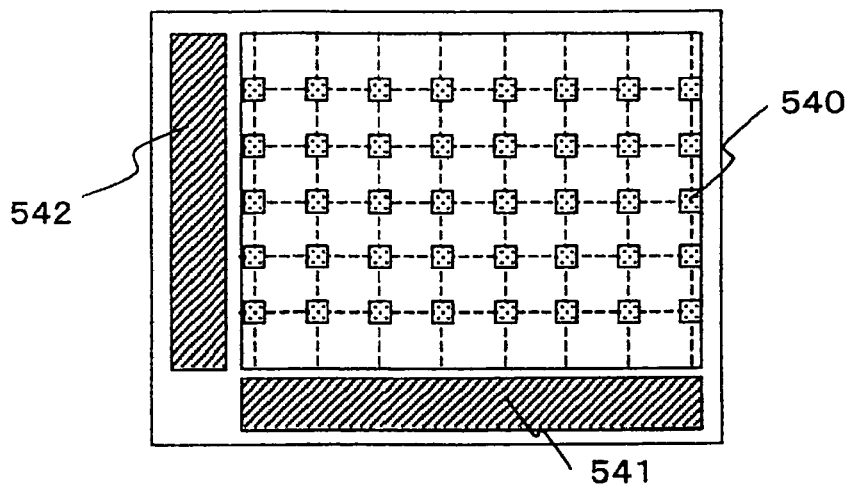
FIG. 22 is a schematic view for explaining a region required for annealing in one panel.

Next, a method for manufacturing a display panel by use of diffracted optical elements according to this embodiment will be described with reference to FIGS. 22–24, 25A–25B, 26A–26B, 27A–27B, 28 and 29A–29B. FIG. 22 is a schematic view for explaining regions to be annealed in one panel. A glass substrate forming one panel, that is, an individual display panel where thin film transistors should be formed is divided into three regions corresponding to a pixel portion 540, a gate driver circuit portion 541 and a drain driver circuit portion 542. In addition thereto, there is an additional peripheral circuit portion, but it is omitted here.

Figure 23:
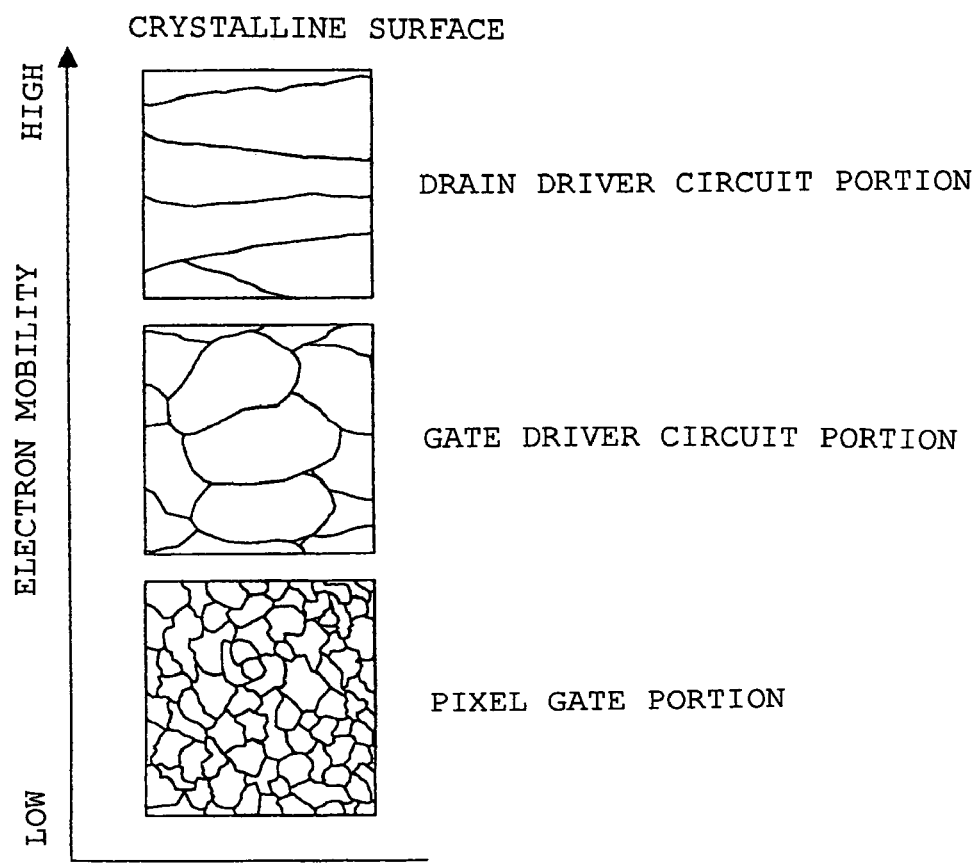
FIG. 23 is an explanatory view showing features of crystals in a silicon film required for each of three regions corresponding to a pixel portion, a gate driver circuit portion and a drain driver circuit portion in FIG. 22.

FIG. 23 is an explanatory view for explaining the features of crystals in a silicon film required in the three regions corresponding to the pixel portion 540, the gate driver circuit portion 541 and the drain driver circuit portion 542 in FIG. 22 respectively. As shown in FIG. 23, crystals having different crystallinities are required in the pixel portion 540, the gate driver circuit portion 541 and the drain driver circuit portion 542 respectively. In the pixel portion 540, a fine grain poly-crystalline silicon film having a mobility of about several tens of $cm^2/V$ is required to perform switching on/off of the gates of thin film transistors. In the gate driver circuit portion 541 for processing and controlling on/off signals for switching pixels, a fine grain poly-crystalline film having a mobility of about 100–200 $cm^2/V$ is required. In the drain driver circuit portion 542 for processing and controlling image data, a so-called lateral grown quasi-single crystalline film having a mobility of 400 $cm^2/V$ or higher is required.

As described previously in FIG. 6, there is a correlation between the laser output and the crystallinity of a silicon film formed by annealing with the laser output. Under the condition that the scanning speed of a laser beam is fixed, a fine grain poly-crystalline film is formed when the power density is low. With the increase of the power density, the lateral growing distance of each crystal grain in the silicon film is accelerated. When the whole area of the silicon film is laser-annealed with a fixed output of a laser oscillator, the laser annealing width will be narrow if the power density is set to be high. On the contrary, if the power density is set to be low, the laser annealing width can be increased relatively.

That is, (1) the power density is set to be low for the pixel portion 540 having the largest area within one display panel and needing a fine grain poly-crystalline silicon film having a low mobility, and the width of the laser beam is widened to perform laser annealing with a wide range.

(2) In laser annealing in the gate driver circuit portion 541 needing a poly-crystalline silicon film having a larger grain size than that of the fine grain poly-crystalline silicon film, the width of the laser beam is narrowed so that the laser annealing is performed with the power density set to be middle.

(3) In the drain driver circuit portion 542 needing a high mobility, the width of the laser beam is further narrowed so that the laser annealing is performed with the power density set to be high enough to accelerate the lateral growth of crystals.

If laser annealing as shown in the paragraphs (1) to (3) can be performed, a silicon film having different crystallinities within one display panel can be formed while making good and efficient use of the laser beam output. That is, it is necessary to provide a technique for forming laser beams having different power densities and different widths accurately and quickly. On this occasion, a plurality of diffracted optical elements each designed to shape a laser beam to have a power density suitable for obtaining desired crystallinity in each region of the pixel portion 540, the gate driver circuit portion 541 and the drain driver circuit portion 542 are retained in a system shown in FIG. 21. When annealing is performed while replacing one diffracted optical element by another, different crystals can be formed within one display panel with high efficiency (high throughput).

Figure 24:
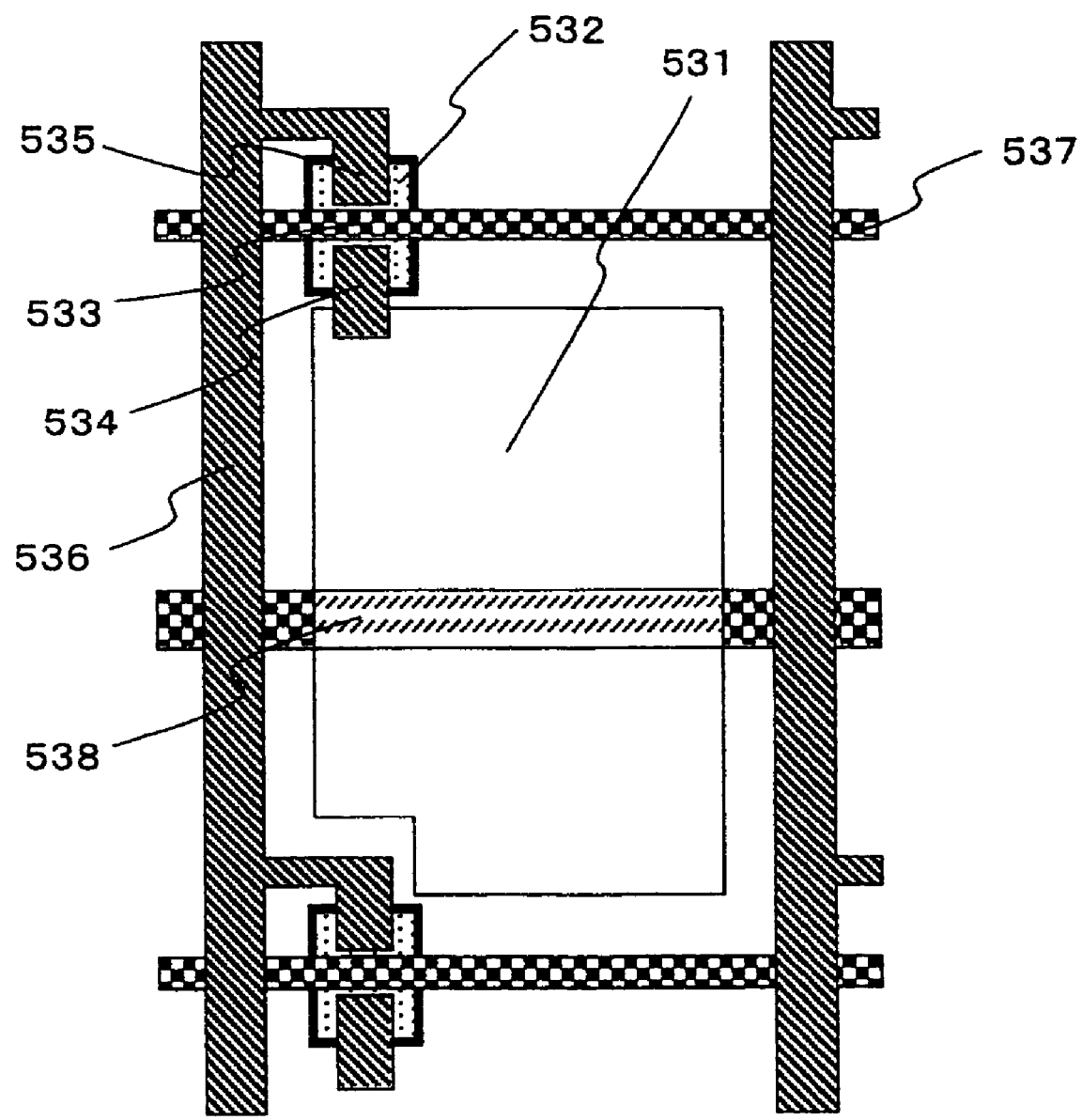
FIG. 24 is a plan view for explaining an example of the configuration of one pixel in a display panel.

FIG. 24 is a plan view for explaining a configuration example of one pixel in a display panel. One pixel of a display panel is constituted by a poly-crystalline silicon (p-Si) thin film transistor (TFT), gate wiring 536, drain wiring 537, and cumulative capacitance 538 for holding charges. The thin film transistor TFT is constituted by a pixel electrode 531, a crystalline semiconductor film (silicon film) 532, a gate electrode 533, a source electrode 534, a drain electrode 535, a gate insulating film (not shown), and an interlayer insulating film (not shown). The gate electrode 533 of the thin film transistor TFT is connected to the gate wiring 536, and the source electrode 534 is connected to the pixel electrode 531. The drain electrode 535 is connected to the drain wiring 537.

The portion of the pixel electrode 531 is several hundreds of microns each side, occupying a major part of the pixel region. In comparison therewith, the region of the semiconductor film 532 made from a silicon film is very small, measuring about 10 μm by 4 μm. In laser annealing using an excimer laser, there is adopted a system in which the whole surface of a large-sized glass substrate for forming a plurality of display panels is annealed in a lump. In a photolithographic step after laser annealing of the whole surface, a major part of the semiconductor film is removed by etching. Thus, there is a problem that a major part of energy is wasted.

If only the region where the gate of the thin film transistor TFT should be formed is selectively irradiated with a laser beam so as to form crystals therein, the energy can be used so effectively that the number of scans with the laser beam can be reduced on a large scale effectively in improvement of throughput. Regions to be laser-annealed in the pixel portion 540 are arrayed in a matrix as shown in FIG. 22. If the diffracted optical element 509 (FIG. 20) to be used for laser-annealing the pixel portion 540 is designed to divide the laser beam at an interval equal to that of the rows or columns of the matrix, only the gate formation regions can be selectively laser-annealed by scanning with the divided laser beams. Thus, the throughput is improved on a large scale.

In a manufacturing process using a large-sized substrate, the size of one display panel and the number of panels that can be formed out of the large-sized substrate differ in accordance with the kind of display panel. That is, due to the difference in pixel pitch, the irradiation pitch of a laser beam has to be changed to laser-anneal a pixel portion. When laser annealing is performed on a different kind of panel, each of a plurality of diffracted optical elements is designed to divide a laser beam at a desired annealing pitch. The diffracted optical elements are retained and replaced in a system shown in FIG. 21. Thus, the optics adjustment time required for changing the kind of panel can be shortened on a large scale.

When the aforementioned systems according to this embodiment, that is, the system in which a plurality of diffracted optical elements are replaced for performing laser annealing while changing the power density of a laser beam so that desired silicon crystal is formed in a desired region in the panel, and the system in which a laser beam is divided by use of a diffracted optical element so as to perform laser annealing selectively on only desired regions of a pixel portion, are used together, a high-throughput crystallization process can be constructed efficiently so that large improvement in throughput can be expected in comparison with that in the background art.

Figure 26:
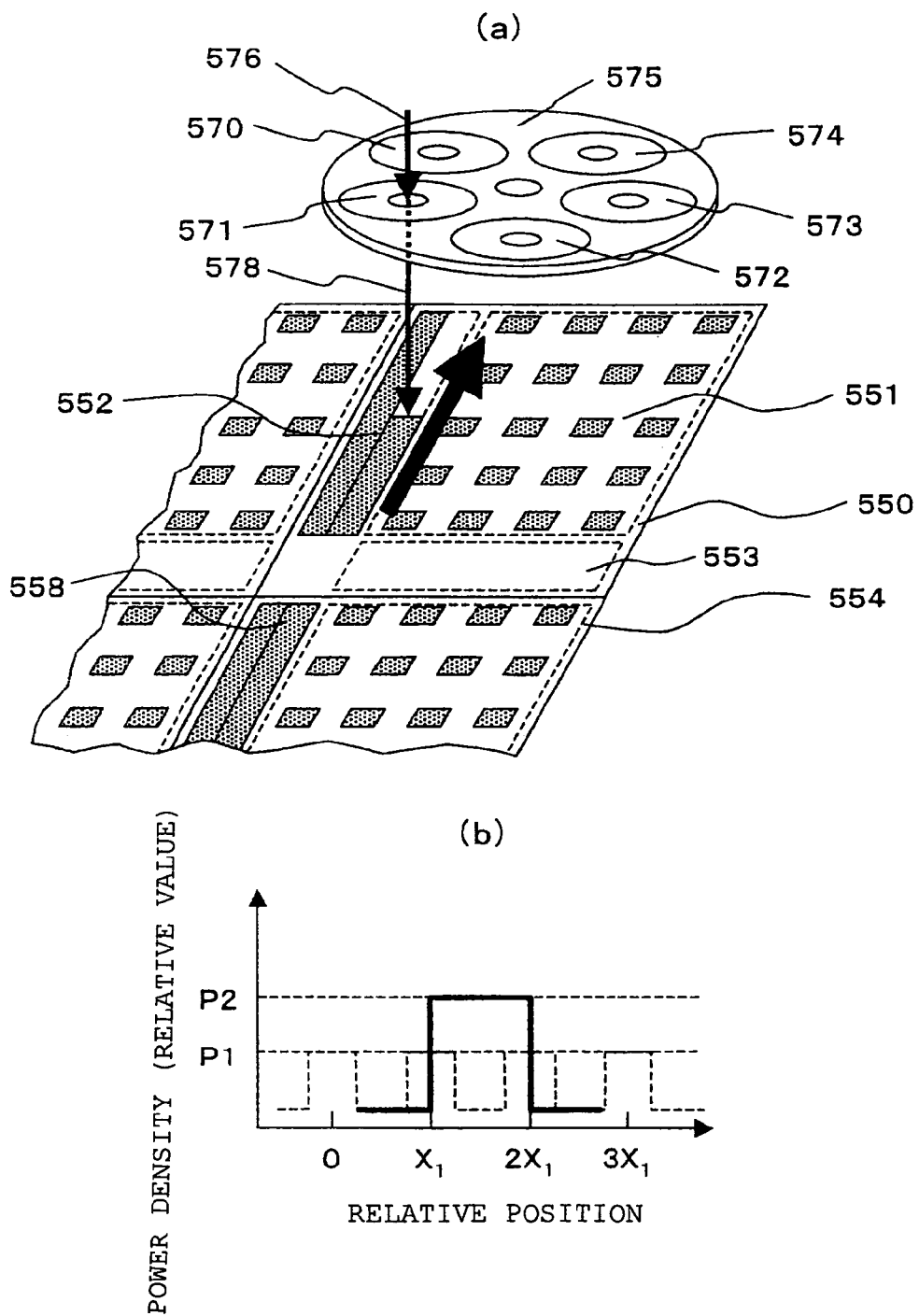
FIGS. 26A–26B are explanatory views for explaining the manufacturing process according to Embodiment 4 of the present invention, following FIGS. 25A–25B.

FIGS. 25A–25B, 26A–26B and 27A–27B are explanatory views of the manufacturing process according to the embodiment. FIGS. 26A–26B show the manufacturing process following that shown in FIGS. 25A–25B, and FIGS. 27A–27B show the manufacturing process following that shown in FIGS. 26A–26B. FIGS. 25A–27A are schematic views representatively showing adjacent four of a plurality of panels to be formed in a large-sized substrate, for explaining a laser annealing process. FIGS. 25B–27B are explanatory diagrams showing the shape and the power density of a laser beam in the process of FIGS. 25A–27A.

A pixel portion 551, a gate driver circuit portion 552 and a drain driver circuit portion 553 are formed in each panel. In this embodiment, a fine grain poly-crystalline film needing no high-speed driving is formed in the pixel portion 551 in any one panel 550, a poly-crystalline film for forming transistors capable of being driven at a higher speed than that in the pixel portion is formed in the gate driver circuit portion 552, and a quasi-single crystalline film for forming transistors capable of being driven at a high speed is formed in the drain driver circuit portion 553.

Diffracted optical elements 570, 571, 572, 573 and 574 are fixed to a diffracted optical element retention/adjustment mechanism 575 having a moving/rotating mechanism so as to be adjusted to make the center of the diffracted optical element 570 coincide with the optical axis of a laser beam 576. Scanning in the thick arrow direction is performed with laser beams 577 divided and shaped through the diffracted optical element 570. Although this scanning is typically performed by moving the glass substrate, the laser beam may be moved. In this event, the diffracted optical element 570 is designed to divide the laser beam 576 into four parts with which four adjacent gate regions in the pixel portion 551 are irradiated simultaneously.

In addition, the four split laser beams 577 divided by the diffracted optical element 570 are shaped to have an equal power density P1 and an equal width as shown in FIG. 25B. Thus, the crystal grain sizes and the crystal region widths formed by irradiation with the laser beams respectively become equal. The power density P1 is set to be a power density high enough to form fine poly-crystalline grains illustrated as the crystal surface of the pixel gate portion in FIG. 23. In addition, the irradiation pitch of the split laser beams 577 coincides with a pitch $X_1$ between adjacent gate regions in the pixel portion 551.

As soon as the laser beams enter a gate configuration region 555 in a pixel portion 565 of a panel 554, a voltage is applied to the EO modulator 503 in FIG. 20 so as to set the power density at P1. Scanning is performed in that state. As soon as irradiation of the gate portion is terminated, the voltage applied to the EO modulator 503 is set so that the power density of the laser beams is zero or low enough not to cause any change in the amorphous silicon film.

As soon as the laser beams enter a subsequent gate region 556, a voltage is applied to the EO modulator 503 again so as to set the laser beams to have the power density P1. Scanning is performed in the same manner as described above. As soon as the laser beams pass over the gate region, the voltage applied to the EO modulator 503 is set so that the power density of the laser beams is zero or low enough not to cause any change in the amorphous silicon film. These operations are repeated, and irradiation of the pixel portion 565 in the panel 554 is terminated.

Next, till the laser beams passing through the drain driver circuit portion 553 of the adjacent panel 550 enters a first gate configuration region 557 of the pixel portion 551, the voltage applied to the EO modulator 503 is set so that the power density of the laser beams is zero or low enough not to cause any change in the amorphous silicon film. Then, as soon as the laser beams enter the gate configuration region 557 in the pixel portion 551, irradiation is started again. When this operation is repeated and irradiation of one line in the thick arrow direction is completed, the laser beams move in a direction perpendicular to the scanning direction, and similar irradiation is started again.

Although FIG. 25A shows that laser annealing on the pixel portions 551 and 565 in one panel is performed in one scan, the actual number of scans depends on the number of pixels of the panel and the number of split beams. Incidentally, laser annealing may be performed either in a fixed direction or by reciprocating scans. While laser annealing in a fixed direction is advantageous in setting the position to be irradiated with a laser beam accurately, annealing by reciprocating scans is advantageous in throughput. The whole surface of the large-sized glass substrate is scanned in such a manner, and laser annealing on the pixel portions 551 and 565 is terminated.

Next, the diffracted optical element retention/adjustment mechanism 575 retaining the plurality of diffracted optical elements rotates around its rotating mechanism so as to replace an element to shape the laser beam. The diffracted optical element retention/adjustment mechanism 575 rotates till the center of the diffracted optical element 571 coincides with the optical axis of the laser beam. As soon as they coincide with each other, the rotation is terminated.

FIGS. 26A–26B are explanatory views of the manufacturing method according to this embodiment following FIGS. 25A–25B. FIG. 26A is a schematic view similar to FIG. 25A, in which the laser annealing process is performed with the laser beam 576 in the state where the center of the diffracted optical element 571 has coincided with the optical axis of the laser beam. FIG. 26B is an explanatory diagram showing the shape and the power density of the laser beam in the process of FIG. 26A.

It is desired to improve the accuracy of the rotating mechanism of the diffracted optical element retention/adjustment mechanism 575 so that an element can be changed only by the operation of rotation. However, the profiler 511 described in FIG. 20 may be moved onto the irradiation plane of the laser beam so as to perform the exchange operation of the element while observing the profile of the laser beam.

Next, laser annealing on the gate driver circuit portion 552 is performed all over the surface of the glass substrate as shown by the thick arrow in FIG. 26A. In this event, as shown in FIG. 26B, a laser beam 578 shaped by the diffracted optical element 571 is set to have a higher power density P2 than the power density P1 used for laser annealing on the pixel portion 551. When the power density increases, the laser annealing width is reduced, but a poly-crystalline silicon film shown as the crystalline surface of the gate driver circuit portion in FIG. 23 can be formed.

When the laser beam 578 enters the gate driver circuit portion 558 in a panel 554 to be irradiated, a voltage is applied to the EO modulator 503 in FIG. 20 so as to set the power density at P2. The laser beam having the power density P2 starts annealing. As soon as the laser beam 578 passes over the gate driver circuit portion 558, the laser beam is set by the EO modulator so as to have a power density that is zero or low enough not to cause any change in the amorphous silicon film.

In that state, the laser beam passing over the lower panel 554 in FIG. 26A enters the upper panel 550. When the laser beam approaches the gate driver circuit portion 552, a voltage is applied to the EO modulator 503 so that the power density of the laser beam 578 is P2. The laser beam having the power density P2 starts annealing. As soon as the laser beam passes over the gate driver circuit portion 552, the power density is set by the EO modulator to be zero or low enough not to cause any change in the amorphous silicon film.

When this operation is repeated and irradiation of one line in the scanning direction is completed, the laser beam moves in a direction perpendicular to the scanning direction, and starts irradiation again. Although FIG. 26A shows that the gate driver circuit portions 552 and 558 in one panel are annealed in two scans with the laser beam, the actual number of scans depends on the width of each gate driver circuit portion in the panel and the width of the laser beam. Incidentally, laser annealing may be performed either in a fixed direction following the scanning direction or by reciprocating scans. While annealing in a fixed direction is advantageous in setting the position to be irradiated with a laser beam accurately, annealing by reciprocating scans is advantageous in throughput. The whole surface of the substrate is scanned in such a manner, and annealing on the gate driver circuit portions 552 and 558 is terminated.

Next, as shown in FIG. 27A, the diffracted optical element retention/adjustment mechanism 575 rotates around its rotating mechanism so as to exchange a diffracted optical element to shape the laser beam. The diffracted optical element retention/adjustment mechanism 575 rotates till the center of the diffracted optical element 572 coincides with the optical axis of the laser beam. As soon as they coincide with each other, the rotation is terminated.

Next, laser annealing on a drain driver circuit portion 560 is performed all over the surface of the glass substrate. In this event, as shown in FIG. 27B, a laser beam 579 shaped by the diffracted optical element 572 is set to have a higher power density P3 than the power density P2 used for laser annealing on the gate driver circuit portion 552 (558). When the power density of the laser beam increases, the laser annealing width is reduced, but a lateral grown poly-crystalline silicon film shown as the crystalline surface of the drain driver circuit portion in FIG. 23 can be formed.

The laser beam 579 performs scanning in a direction perpendicular to the aforementioned scanning direction of the gate driver circuit portion as shown in the thick arrow in FIG. 27A. In this event, the laser beam or the stage 515 (FIG. 20) may be moved in a direction perpendicular to the previous scanning direction used for laser annealing on the gate driver circuit portion. Alternatively, after laser annealing on the gate driver circuit portion is terminated and before laser annealing on the drain driver circuit portion 560 (553) is performed, the glass substrate may be mounted on the stage so as to be rotated at an angle of 90 degrees by a conveyance robot (not shown). In this system, the laser beam or the stage is moved in a parallel to the scanning direction used for scanning the gate driver circuit portion.

When the laser beam 579 shaped by the diffracted optical element 572 enters the drain driver circuit portion 560 in a panel 559 to be irradiated, a voltage is applied to the EO modulator 503 (FIG. 20) so as to set the power density at P3 as shown in FIG. 27B. The laser beam having the power density P3 starts annealing. As soon as the laser beam 579 passes over the drain driver circuit portion 560, the laser beam is set by the EO modulator 503 so as to have a power density that is zero or low enough not to cause any change in the amorphous silicon film. In that state, the laser beam passing over the left panel 559 in FIG. 27A enters the right panel 550. When the laser beam approaches the drain driver circuit portion 553 of the panel 550, a voltage is applied to the EO modulator 503 so that the power density is P3. The laser beam having the power density P3 starts annealing. As soon as the laser beam passes over the drain driver circuit portion 553, the power density is set by the EO modulator 503 to be zero or low enough not to cause any change in the amorphous silicon film. When this operation is repeated and irradiation of one line in the scanning direction of the laser beam is completed, the laser beam moves in a direction perpendicular to the scanning direction, and starts irradiation again.

Although FIG. 27A shows that the drain driver circuit portion 553, 560 in one panel is laser-annealed in three scans with the laser beam, the actual number of scans depends on the width of the drain driver circuit portion 553, 560 in the panel and the width of the laser beam 579. Incidentally, laser annealing may be performed either in a fixed direction following the scanning direction or by reciprocating scans. While annealing in a fixed direction is advantageous in setting the position to be irradiated with a laser beam accurately, annealing by reciprocating scans is advantageous in throughput. The whole surface of the substrate is scanned in such a manner, and annealing on the drain driver circuit portions 553 and 560 is terminated.

Figure 28:
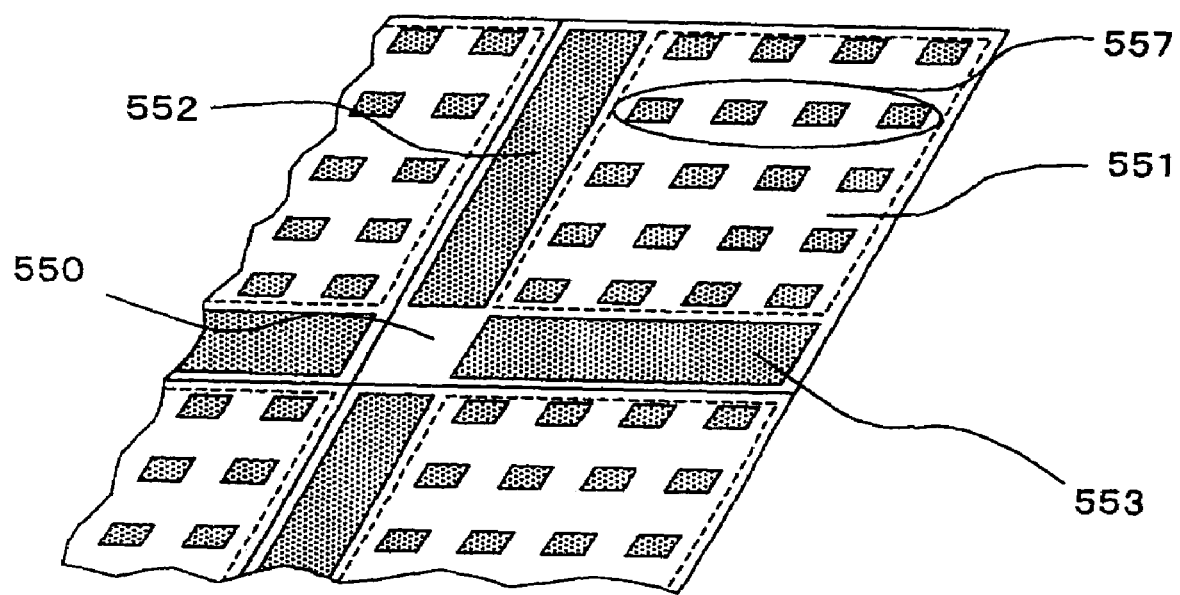
FIG. 28 is a schematic view for explaining the panel subjected to laser annealing according to Embodiment 4 of the present invention.

FIG. 28 is a schematic view for explaining panels subjected to laser annealing according to this embodiment. Description will be made using a desired panel 550 in FIG. 28. Fine poly-crystalline grains are selectively formed in the gate configuration region 557 of each thin film transistor in the pixel portion 551 of the panel 550. Poly-crystalline grains are formed in the gate driver circuit portion 552. Lateral grown quasi-single crystalline grains are formed in the drain driver circuit portion 553.

Also according to this embodiment, annealing is performed to provide performance corresponding to required performance of a silicon film forming thin film transistors in each region including a region where switching thin film transistors for forming a pixel portion should be formed, a region where a peripheral circuit including a driver circuit should be formed, and so on. Thus, it is possible to manufacture display panels at a high yield rate.

[Embodiment 5]

Next, description will be made on Embodiment 5 in which laser annealing is performed while changing the kind of display panel. FIGS. 29A–29B are explanatory views of a manufacturing process according to Embodiment 5 of the present invention. FIG. 29A is a schematic view representatively showing adjacent four of a plurality of panels to be formed in a large-sized substrate, for explaining a laser annealing process. FIG. 29B is an explanatory diagram showing the shape and the power density of a laser beam in the process of FIG. 29A.

Though not shown in FIG. 29A, the diffracted optical element retention/adjustment mechanism 575 retaining the plurality of diffracted optical elements 570 to 574 rotates around its rotating mechanism so as to exchange a diffracted optical element to shape the laser beam in the same manner in Embodiment 4. The retention/adjustment mechanism 575 rotates till the center of the selected diffracted optical element 573 coincides with the optical axis of the laser beam 576. As soon as they coincide with each other, the rotation is terminated.

As shown in FIG. 29A, the kind of display panel is different from the kind of display panel in the aforementioned embodiments. Assume that the pixel pitch in one panel to be laser-annealed is $X_2$. The diffracted optical element 573 is designed to divide the laser beam 576 into four so that the interval of split laser beams 580 coincides with the pitch $X_2$ between gate regions forming thin film transistors in adjacent pixel portions.

Although the number of split laser beams is set at four in this embodiment, the actual number of split laser beams depends on the laser beam output and the power density required for crystallization per split laser beam. Although each laser beam is set to have the aforementioned power density P1 used for forming the gate region in the pixel portion as shown in FIG. 29B, the laser beam may be set at a different power density and a different laser beam width. Description will be made on an annealing process using a desired one panel 561. Only gate configuration regions of a pixel portion 562 in the panel 561 are irradiated and laser-annealed with laser beams 580 divided selectively while the laser beams are modulated by the EO modulator 503 (FIG. 20) in the same manner as in the aforementioned embodiments. When laser annealing on the pixel portion 562 in the glass substrate is wholly terminated, the diffracted optical element is exchanged to perform laser annealing on a gate driver circuit portion 563 and a drain driver circuit portion 564.

Although this embodiment has shown the case where the laser annealing is performed on the pixel portion 562, the gate driver circuit portion 563 and the drain driver circuit portion 564 in that order, the order may be changed. In such a manner, different crystals are formed at high throughput while a plurality of diffracted optical elements are exchanged. Also according to this embodiment, annealing is performed to provide performance corresponding to required performance of a silicon film forming thin film transistors in each region including a region where switching thin film transistors for forming a pixel portion should be formed, a region where a peripheral circuit including a driver circuit should be formed, and so on. Thus, it is possible to manufacture display panels at a high yield rate.

[Embodiment 6]

Description will be made on further another embodiment of the present invention. Embodiment 6 is different from the aforementioned embodiments as follows. That is, a temporally modulated solid-state continuous-wave laser and a solid-state pulsed laser are used together as oscillators. A diffracted optical element disposed in an optics is exchanged to shape laser beams. A substrate is irradiated with the shaped laser beams so that crystals having different crystallinities are formed in one panel.

Figure 30:
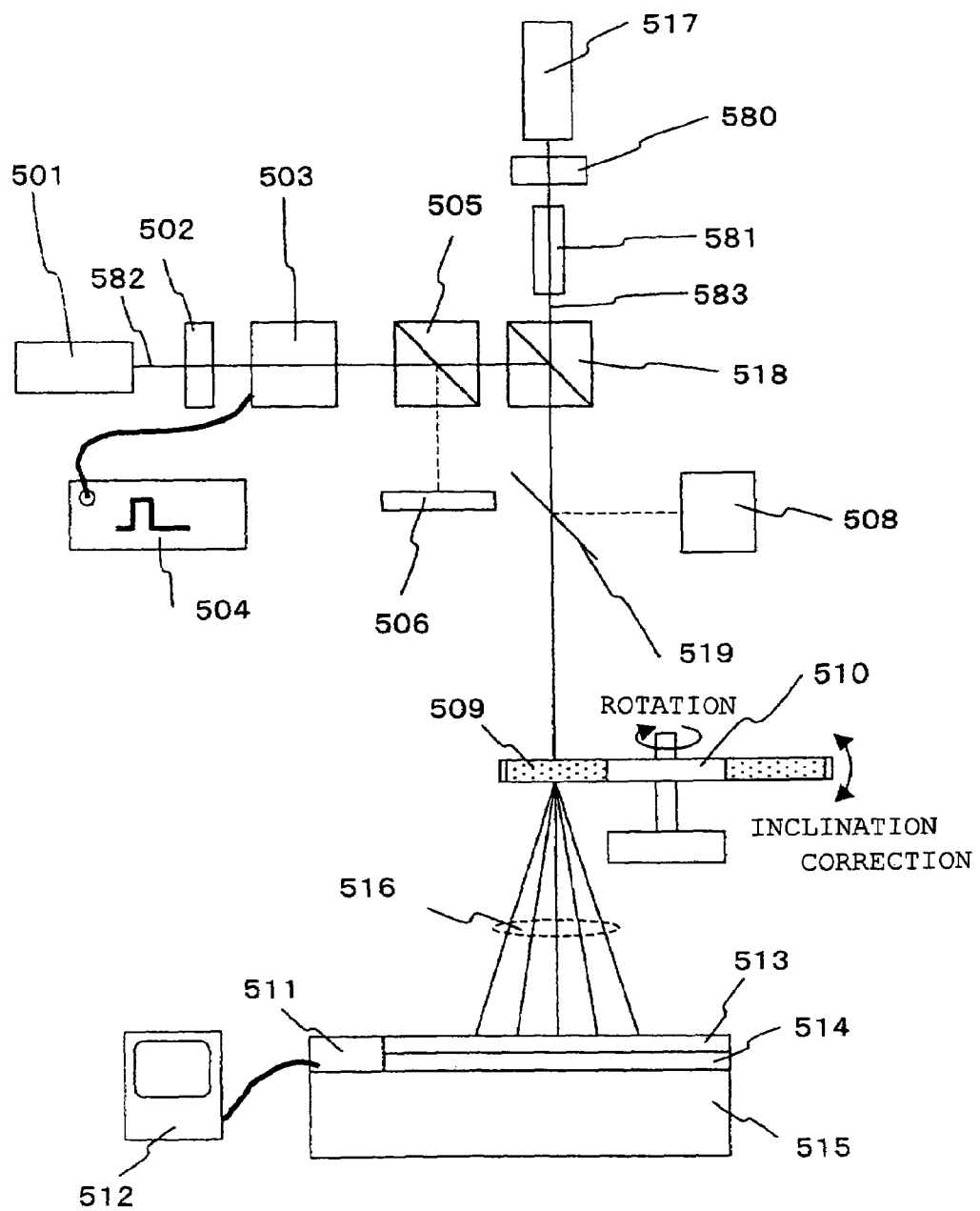
FIG. 30 is a configuration view of a laser annealing apparatus for explaining a manufacturing method according to Embodiment 6 of the present invention.

FIG. 30 is a configuration view of a laser annealing apparatus for explaining Embodiment 6 of a method for manufacturing a display panel according to the present invention. The configuration of the laser annealing apparatus is fundamentally similar to that in FIG. 20. FIG. 30 is different from FIG. 20 in that a polarized beam splitter 518 is disposed in an annealing optics for a continuous-wave laser beam 582 outputted from a continuous-wave laser 501, and a solid-state pulsed laser beam 583 is introduced into the optical axis of the continuous-wave laser beam so as to be shaped by one and the same shaping optics. The optical axes of the continuous-wave laser 501 and a solid-state pulsed laser 517 coincide with each other perfectly after the polarized beam splitter 518. In addition, FIG. 30 is also different from FIG. 20 in that an energy adjustment mechanism (ND filter) 580 for adjusting the output of the laser beam 583, and a beam expander 581 for making the beam diameter of the continuous-wave laser beam 582 coincide with the beam diameter of the solid-state pulsed laser beam 583 on a diffracted optical element.

On the downstream side of the polarized beam splitter 518, a beam splitter 519 and a laser beam output monitor 508 are disposed as shown in FIG. 30, so as to monitor the laser beam output. Although this embodiment describes an example in which annealing is performed while the optical axes of the continuous-wave laser beam and the solid-state pulsed laser beam are made to coincide with each other, an optics for the continuous-wave laser beam and an optics for the pulsed laser beam may be arranged separately. In this case, the laser beam can be switched by moving the stage 515. An amorphous silicon film 513 formed on a glass substrate 514 is irradiated with laser beams 516 divided into a desired number of splits and shaped into a desired rectangular shape by a diffracted optical element.

An automatic focusing optics and a panel surface observing optics used when the glass substrate 514 is irradiated with the laser beams 516 are similar to those in Embodiment 5. Although the aforementioned embodiment describes an example in which the objective lens 11 as described in FIG. 1 serves to realize a sample surface observation system and an irradiation system concurrently, the observation optical system using the objective lens 11 and the irradiation system may exist independently.

Generally when a silicon film is annealed with a pulsed laser beam, there is a correlation between the pulse width of the laser beam and the crystallinity of a poly-crystalline film formed thereby. When an amorphous silicon film is irradiated with a laser beam having a pulse width of about several tens of nanoseconds (ns), the silicon film is made poly-crystalline through a fusion and re-solidification process. Thus, fine poly-crystalline grains and poly-crystalline grains as described in FIG. 23 are formed. The size of the crystal grains depends on the wavelength of the laser beam, the pulse width and the number of multiple irradiations. When laser annealing is performed with optimal parameters being selected, a poly-crystalline silicon film composed of crystals having a grain size of about 100 nm can be obtained.

As described previously, an excimer laser adopted broadly in a process for laser-annealing an amorphous silicon film has a wide variation in energy among pulses so that the process margin is narrow. Further, the variation in energy leads directly to a variation in performance of transistors formed using the poly-crystalline film obtained by the annealing. On the other hand, a solid-state pulsed laser has a small variation in energy among pulses so that the process margin is wide. Further, a poly-crystalline silicon film having uniform performance can be obtained stably. Accordingly, the solid-state pulsed laser can be adopted as an alternative to the excimer laser annealing which is a background-art technique, and can be applied to formation of pixel transistors.

A pulsed laser beam is shaped and divided by use of a diffracted optical element, and pixel portion gate regions are selectively annealed with the split laser beams each having an energy density high enough to form poly-crystals the most suitable for the pixel portion. In such a manner, a stable poly-crystalline film can be obtained with a high efficiency (high throughput) in the same manner as in the pixel portion annealing using a continuous-wave solid-state laser as described in the aforementioned embodiments.

Also according to this embodiment, annealing is performed to provide performance corresponding to required performance of a silicon film forming thin film transistors in each region including a region where switching thin film transistors for forming a pixel portion should be formed, a region where a peripheral circuit including a driver circuit should be formed, and so on. Thus, it is possible to manufacture display panels at a high yield rate.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

We claim:

1. A method for manufacturing a display panel, comprising the steps of:
   forming an amorphous silicon film on an insulating substrate forming a display panel;
   irradiating said amorphous silicon film with a laser beam to thereby transform said amorphous silicon film into a poly-crystalline silicon film; and
   building thin film transistors in said poly-crystalline silicon film;
   wherein a pixel region and a peripheral circuit region in said insulating substrate are irradiated with a temporally modulated continuous-wave laser beam with a power density allowing lateral growth through a fusion and re-solidification process and at a fixed scanning speed so as to form a lateral grown poly-crystalline film in said scanning direction, and said thin film transistors are built in said lateral grown poly-crystalline film.

2. A method for manufacturing a display panel, comprising the steps of:
   forming an amorphous silicon film on an insulating substrate forming a display panel;
   irradiating said amorphous silicon film with a laser beam to thereby transform said amorphous silicon film into a poly-crystalline silicon film; and
   building thin film transistors in said poly-crystalline silicon film;
   wherein said laser beam is a temporally modulated continuous-wave laser beam, and said insulating substrate is irradiated with said laser beam with a plurality of power densities and at a fixed scanning speed, so that poly-crystalline silicon films having different crystallinities are formed in a plurality of regions in said insulating substrate respectively, and said thin film transistors are built in said poly-crystalline silicon films having different crystallinities.

3. A method for manufacturing a display panel, comprising the steps of:
   forming an amorphous silicon film on an insulating substrate forming a display panel;
   irradiating said amorphous silicon film with a laser beam to thereby transform said amorphous silicon film into a poly-crystalline silicon film; and
   building thin film transistors in said poly-crystalline silicon film;
   wherein said laser beam is a temporally modulated continuous-wave laser beam, and said insulating substrate is irradiated with said laser beam with two stages of power densities including a first power density and a second power density and at a fixed scanning speed, so that a first poly-crystalline silicon film is formed in a first region in said insulating substrate by said first power density, while a second poly-crystalline silicon film is formed in a second region in said insulating substrate by said second power density, and said thin film transistors are built in said first and second poly-crystalline silicon films.

4. A method for manufacturing a display panel according to claim 3, wherein said first region includes a pixel region and a gate driver circuit region, and said first poly-crystalline film is a fine grain poly-crystalline film, while said second region is a region including a drain driver circuit, and said second poly-crystalline film is a lateral grown poly-crystalline film.

5. A method for manufacturing a display panel according to claim 3, wherein said first region is a pixel region, and said first poly-crystalline film is a fine grain poly-crystalline film, while said second region is a region including gate and drain driver circuits, and said second poly-crystalline film is a lateral grown poly-crystalline film.

6. A method for manufacturing a display panel, comprising the steps of:
   forming an amorphous silicon film on an insulating substrate forming a display panel;
   irradiating said amorphous silicon film with a laser beam to thereby transform said amorphous silicon film into a poly-crystalline silicon film; and
   building thin film transistors in said poly-crystalline silicon film;
   wherein said laser beam is a temporally modulated continuous-wave laser beam, and said insulating substrate is irradiated with said laser beam with three stages of power densities and at a fixed scanning speed, so that a first poly-crystalline silicon film is formed in a first region in said insulating substrate by a first power density, a second poly-crystalline silicon film is formed in a second region in said insulating substrate by a second power density, a third poly-crystalline silicon film is formed in a third region in said insulating substrate by a third power density, and said thin film transistors are built in said first, second and third poly-crystalline silicon films.

7. A method for manufacturing a display panel according to claim 6, wherein said first region is a pixel region, and said first poly-crystalline film is a fine grain poly-crystalline film, while said second region is a gate driver circuit region, and said second poly-crystalline film is a lateral grown poly-crystalline film, while said third region is a region including a drain driver circuit, and said third poly-crystalline film is a lateral grown poly-crystalline film, while crystal grains in said third region are larger than crystal grains in said second region.

8. A method for manufacturing a display panel, comprising the steps of:
   forming an amorphous silicon film on an insulating substrate forming a display panel;
   irradiating said amorphous silicon film with a laser beam to thereby transform said amorphous silicon film into a poly-crystalline silicon film; and
   building thin film transistors in said poly-crystalline silicon film;
   wherein said laser beam is a temporally modulated continuous-wave laser beam, and said amorphous silicon film is irradiated with said laser beam shaped to be linear with m stages (m is a natural number) of power densities by m kinds of diffracted optical elements, so that m kinds of poly-crystalline films are formed in m kinds of regions in said insulating substrate, and said thin film transistors are built in said m kinds of regions.

9. A method for manufacturing a display panel according to claim 8, wherein at least one kind of said regions is irradiated with laser beams divided in n splits (n is a natural number) and shaped by a diffracted optical element so that n poly-crystalline films are formed concurrently, and said poly-crystalline films are fine grain poly-crystalline films.

10. A method for manufacturing a display panel according to claim 8, wherein m is 2, while said first region is a pixel region, and said first poly-crystalline film is a fine grain poly-crystalline film, while said second region includes a gate driver circuit region and a region including a drain driver circuit, and said second poly-crystalline film is a lateral grown poly-crystalline film.

11. A method for manufacturing a display panel according to claim 8, wherein m is 3, while said first region is a pixel region, and said first poly-crystalline film is a fine grain poly-crystalline film, while said second region is a gate driver circuit region, and said second poly-crystalline film is a lateral grown poly-crystalline film, while said third region is a drain driver circuit region, and said third poly-crystalline film is a lateral grown poly-crystalline film, while crystal grains in said third region are larger than crystal grains in said second region.

12. A method for manufacturing a display panel, comprising the steps of:
    forming an amorphous silicon film on an insulating substrate forming a display panel;
    irradiating said amorphous silicon film with a laser beam to thereby transform said amorphous silicon film into a poly-crystalline silicon film; and
    building thin film transistors in said poly-crystalline silicon film;
    wherein said laser beam includes a solid-state pulsed laser beam and a temporally modulated continuous-wave laser beam, and said amorphous silicon film is irradiated with said laser beam with three stages of power densities using diffracted optical elements, while said solid-state pulsed laser beam is divided into n splits (n is a natural number) by a first one of said diffracted optical elements, and a first region is irradiated with said split laser beams each having a first power density so as to form n first poly-crystalline films concurrently, while a second region is irradiated with said continuous-wave laser beam having a second power density using a second one of said diffracted optical elements so as to form a second poly-crystalline film, while a third region is irradiated with said continuous-wave laser beam having a third power density using a third one of said diffracted optical elements so as to form a third poly-crystalline film.

13. A method for manufacturing a display panel according to claim 12, wherein said first region is a pixel region, and said first poly-crystalline film is a fine grain poly-crystalline film, while said second region is a gate driver circuit region, and said second poly-crystalline film is a lateral grown poly-crystalline film, while said third region is a drain driver circuit region, and said third poly-crystalline film is a lateral grown poly-crystalline film, while crystal grains in said third region are larger than crystal grains in said second region.

* * * * *